US011764766B2

(12) United States Patent
Lai et al.

(10) Patent No.: US 11,764,766 B2
(45) Date of Patent: Sep. 19, 2023

(54) FLIP FLOP CIRCUIT

(71) Applicant: Taiwan Semiconductor Manufacturing Company, Ltd., Hsinchu (TW)

(72) Inventors: Po-Chia Lai, Fremont, CA (US); Stefan Rusu, Sunnyvale, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 120 days.

(21) Appl. No.: 17/148,661

(22) Filed: Jan. 14, 2021

(65) Prior Publication Data

US 2022/0038080 A1    Feb. 3, 2022

Related U.S. Application Data

(60) Provisional application No. 63/059,258, filed on Jul. 31, 2020.

(51) Int. Cl.
| | |
|---|---|
| *H03K 3/037* | (2006.01) |
| *H03K 3/3562* | (2006.01) |
| *G01R 31/3185* | (2006.01) |
| *H03K 3/356* | (2006.01) |

(52) U.S. Cl.
CPC . *H03K 3/35625* (2013.01); *G01R 31/318541* (2013.01); *H03K 3/356008* (2013.01)

(58) Field of Classification Search
CPC ............... H03K 3/037; H03K 3/35625; H03K 3/02332; H03K 3/0372; H03K 3/289; H03K 3/3562; H03K 3/0233; H03K 3/312

USPC ........ 327/199, 202, 203, 204, 212, 215, 218
See application file for complete search history.

(56) References Cited

U.S. PATENT DOCUMENTS

| | | | |
|---|---|---|---|
| 8,493,121 B1* | 7/2013 | Ramaraju | H03K 3/356156 327/203 |
| 10,326,430 B2* | 6/2019 | Lai | H03K 3/02332 |
| 2017/0126212 A1 | 5/2017 | Liao et al. | |
| 2018/0278244 A1 | 9/2018 | Savanth et al. | |

OTHER PUBLICATIONS

Taiwan Office Action; Application No. 110119118, dated Mar. 3, 2022.

* cited by examiner

*Primary Examiner* — Hai L Nguyen
(74) *Attorney, Agent, or Firm* — Jones Day

(57) ABSTRACT

A flip flop circuit includes a first master portion, a second master portion, at least one determining portion and a slave portion. The first master portion is configured to operate at a first mode and to receive a first input and generate first master outputs. The second master portion is configured to operate at a second mode and to receive a second input and generate second master outputs. The at least one determining portion is configured to receive at least one enable signal, and has determining inputs and determining outputs. The determining inputs are connected to the first master outputs and the second master outputs. The determining portion is configured to determine the determining outputs being the first master outputs or the second master outputs according to the at least one enable signal. The slave portion is configured to receive the determining outputs and generate an output signal.

20 Claims, 15 Drawing Sheets

FLIP FLOP CIRCUIT

CROSS REFERENCE TO RELATED APPLICATIONS

This application is related to Applicant's previously filed U.S. application Ser. No. 63/059,258, filed Jul. 31, 2020, which is herein incorporated by reference.

BACKGROUND

Flip-flop circuits are used to store data. By controlling power, performance, and fabrication area characteristics of a flip flop (e.g., by limiting the number of components used to implement the flip flop), faster, more power efficient flip flops can be realized using less circuit fabrication space.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
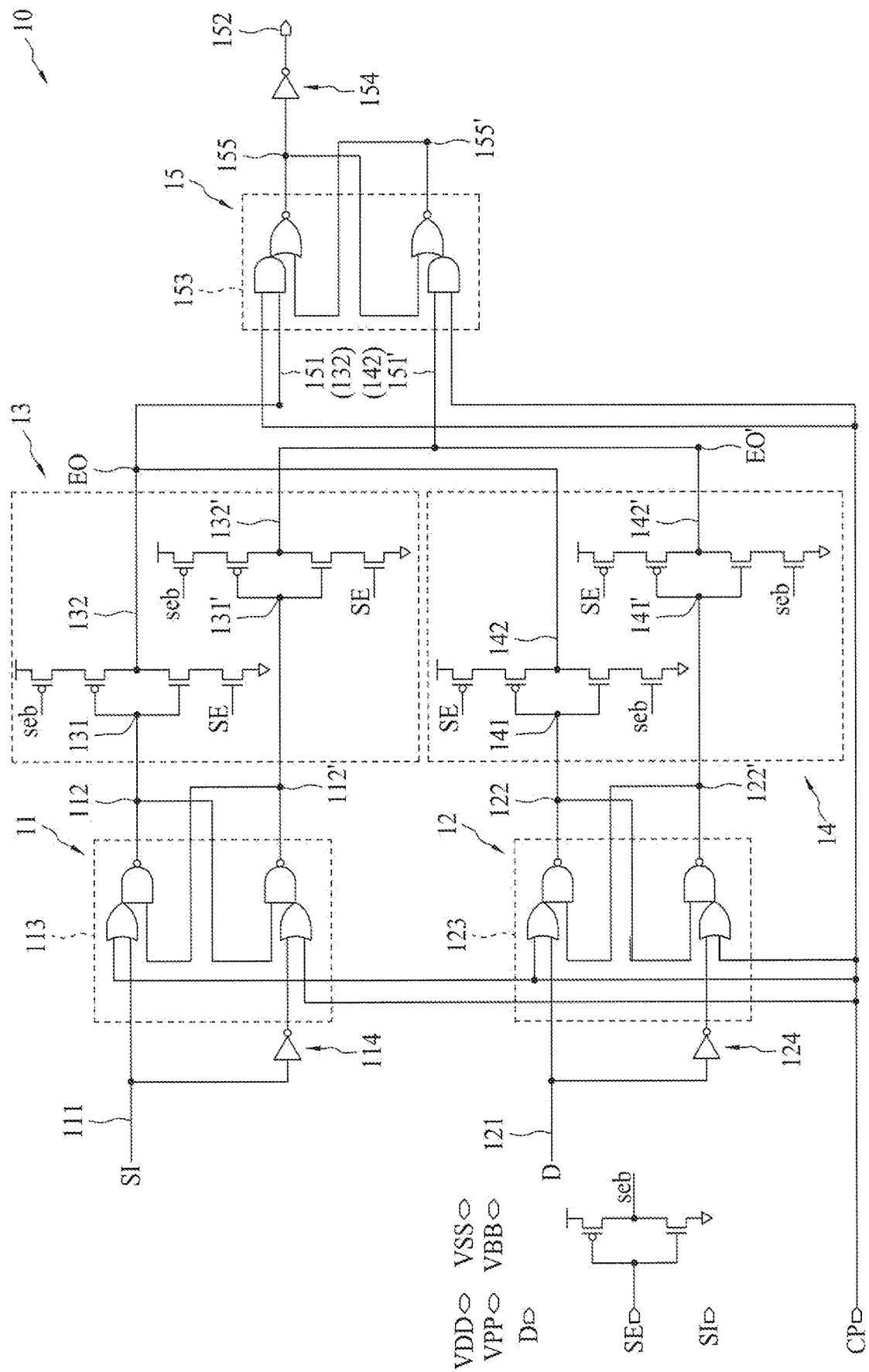
FIG. 1 illustrates a gate-level circuit diagram of a flip flop circuit in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Flip flop circuit implementations may use one or more signal inversions from scan multiplexer used for the selection of scan input and data input. Such inversions of the scan multiplexer take time and power to accomplish, while components for implementing those inversions and transmission gates for implementing the flip flop require circuit area. Limiting circuit components can improve circuit power, performance, and area characteristics. In accordance with some embodiments of the present disclosure, the flip flop circuit may reduce signal inversions on the signal path by replacing or merging the scan multiplexer to make the speed of the flip-flop circuit faster and to reduce power consumption and design complexity of the flip-flop circuit.

FIG. 1 illustrates a gate-level circuit diagram of a flip flop circuit in accordance with some embodiments of the present disclosure. Referring to FIG. 1, a flip flop circuit 10 includes a first master portion 11, a second master portion 12, at least one determining portion 13, 14 and a slave portion 15. The first master portion 11 is configured to operate at a first mode and to receive a first input 111 and generate first master outputs 112, 112'. The second master portion 12 is configured to operate at a second mode and to receive a second input 121 and generate second master outputs 122, 122'. In accordance with some embodiments of the present disclosure, the first mode may be a testing mode, and the second mode may be a normal mode. The first input 111 may be a scan-in signal (SI) and the second input 121 may be a data signal (D).

In accordance with some embodiments of the present disclosure, when the first master portion 11 operates under the testing mode, the first master portion 11 receives the scan-in signal 111 and generates the first master outputs 112, 112' (scan-out signal). In some embodiments, fault(s) of one or more flip-flop circuits (i.e., one or more malfunctioning flip-flop circuits) may be detected by comparing one or more differences between the scan-in signal 111 and the scan-out signal 112, 112'. And such a malfunctioning flip-flop circuit may be used to pinpoint which corresponding subset of logic gates are malfunctioning. In accordance with some embodiments of the present disclosure, the scan-in signal 111 may be used to provide the above-mentioned scan test. In some embodiments, the scan-in signal 111 may include one or more test patterns that are used to detect a fault of a flip-flop circuit, as mentioned above. Such scan-in signal 111 may be provided by an automatic test pattern generation (ATPG) technology.

In accordance with some embodiments of the present disclosure, when the second master portion 112 operates under the normal mode, the second master portion 12 receives the data signal 121 provided from the respective subset of logic gates of the to-be tested circuit. In accordance with some embodiments of the present disclosure, the data signal 121 may include data generated based on logic operations of the respective subset of logic gates.

In accordance with some embodiments of the present disclosure, the first master portion 11 includes a first pair of cross-coupled Or-And-Inverter (OAI) logic gates 113 and a first master inverter 114, and the second master portion 12 includes a second pair of cross-coupled Or-And-Inverter (OAI) logic gates 123 and a second master inverter 124, and the slave portion 15 includes a pair of cross-coupled And-Or-Inverter (AOI) logic gates 153 and a slave inverter 154. The term "cross-coupled" used herein means that the two OAI's in the first pair of cross-coupled Or-And-Inverter (OAI) logic gates 113 each includes an output coupled to the other's input. Similarly, the two OAI's in the second pair of cross-coupled Or-And-Inverter (OAI) logic gates 123 each includes an output coupled to the other's input, and the two AOI's in the pair of cross-coupled And-Or-Inverter (AOI) logic gates 153 each includes an output coupled to the other's input.

In accordance with some embodiments of the present disclosure, the first pair of cross-coupled Or-And-Inverter (OAI) logic gates 113 are coupled to the first input (scan-in signal) 111, an output of the first master inverter 114, and a clock signal CP. Similarly, the second pair of cross-coupled Or-And-Inverter (OAI) logic gates 123 are coupled to the second input (data signal) 121, an output of the second master inverter 124, and the clock signal CP. The first pair of cross-coupled Or-And-Inverter (OAI) logic gates 113 and the second pair of cross-coupled Or-And-Inverter (OAI) logic gates 123 are configured to perform the "OAI" logic function. The pair of cross-coupled And-Or-Inverter (AOI) logic gates 153 are coupled to slave inputs 151, 151' and the clock signal CP. The pair of cross-coupled And-Or-inverter (AOI) logic gates 153 are configured to perform the "AOI" logic function.

Figure 2:
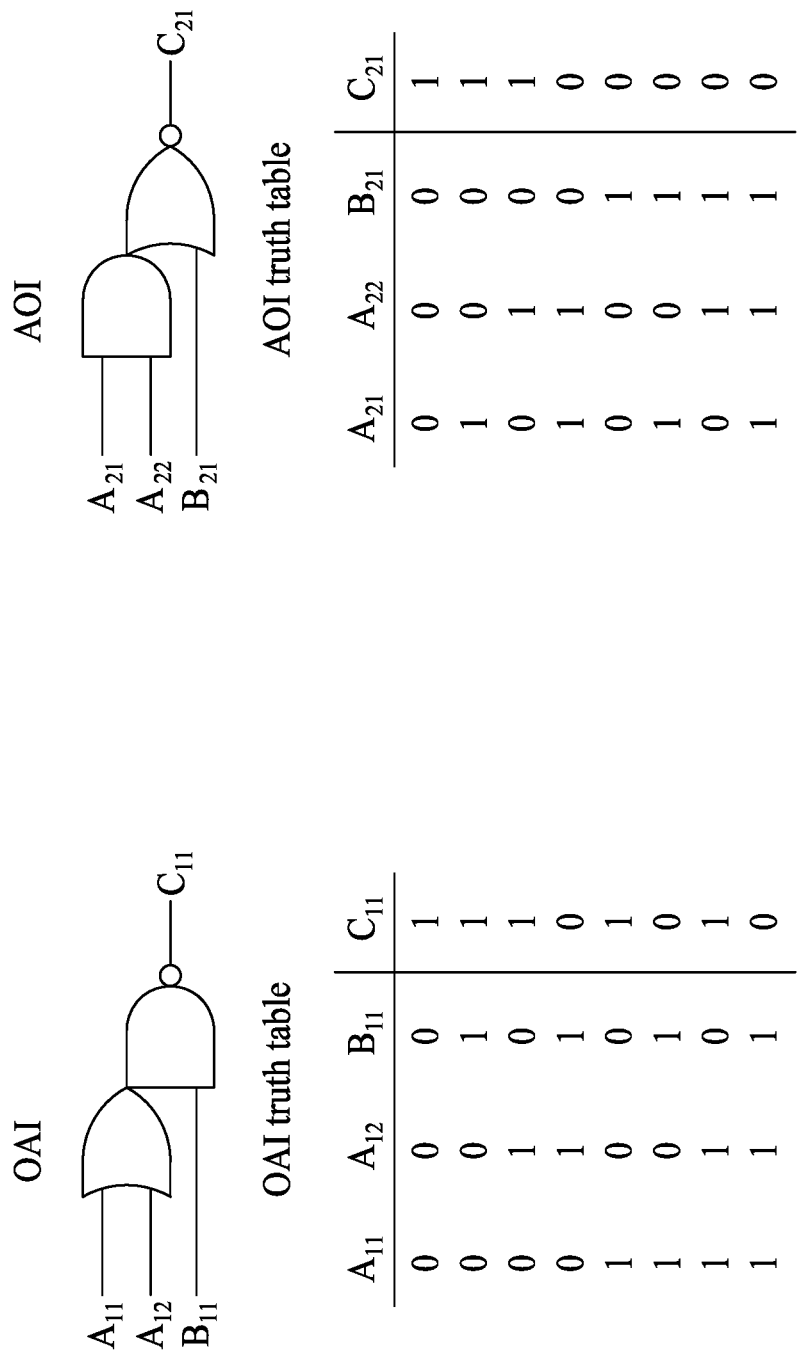
FIG. 2 illustrates exemplary circuit diagrams of an OR-AND-Inverter (OAI) logic gate and an AND-OR-Inverter (AOI) logic gate, and the respective truth tables, in accordance with some embodiments of the present disclosure.

FIG. 2 illustrates exemplary circuit diagrams of an OR-AND-Inverter (OAI) logic gate and an AND-OR-Inverter (AOI) logic gate, and the respective truth tables, in accordance with some embodiments of the present disclosure. Referring to FIG. 2, an OAI and an AOI, and their respective truth tables (OAI truth table and AOI truth table) are shown. In accordance with some embodiments of the present disclosure, the two OAI's of the first pair of cross-coupled Or-And-Inverter (OAI) logic gates 113 each has a substantially similar functionality to the OAI in FIG. 2, and the two OAPs of the second pair of cross-coupled Or-And-Inverter (OAI) logic gates 123 each has a substantially similar functionality to the OAI in FIG. 2. Accordingly, each of the OAPs may use the corresponding truth table as shown in FIG. 2 (i.e., the "OAI truth table") to perform the above-mentioned OAI logic function. Similarly, the AOI's of the pair of cross-coupled And-Or-Inverter (AOI) logic gates 153 each has a substantially similar functionality to the AOI in FIG. 2. Thus, each of the AOI's may use the truth table as shown in FIG. 2 (i.e., the "AOI truth table") to perform the above-mentioned AOI logic function.

In accordance with some embodiments of the present disclosure, referring to FIG. 1 and FIG. 2, one OAI of the first pair of cross-coupled Or-And-Inverter (OAI) logic gates 113 may use the first input (scan-in signal) 111 as $A_{11}$, the clock signal CP as $A_{12}$, and one of the first master outputs 112 as $B_{11}$, and the other first master output 112' as output $C_{11}$, wherein a logical state of the other first master output 112' is determined by the OAI truth table and a combination of logical states of the signals 111, CP, and 112. For example, when the logical states of the signals 111, CP, and 112 are at a logical "1," a logical "0," and a logical "1," respectively, according to the OAI truth table, the other first master output 112' is at a logical "0." One OAI of the second pair of cross-coupled Or-And-Inverter (OAI) logic gates 123 may use the second input (data signal) 121 as $A_{11}$, the clock signal CP as $A_{12}$, and one of the second master outputs 122 as $B_{11}$, and the other second master output 122' as output $C_{11}$, wherein a logical state of the other second master output 122' is determined by the OAI truth table and a combination of logical states of the signals 121, CP, and 122. Similarly, one AOI of the pair of cross-coupled And-Or-Inverter (AOI) logic gates 153 may use one of the slave inputs 151 as $A_{21}$, the clock signal CP as $A_{22}$, and one of the slave outputs 155 as $B_{21}$, and the other slave output 155' as output $C_{21}$, wherein a logical state of the other slave output 155' is determined by the AOI truth table and a combination of logical states of the signals 151, CP, and 155.

In accordance with some embodiments of the present disclosure, the at least one determining portion 13, 14 is configured to receive at least one enable signal SE/seb, and having determining inputs and determining outputs. The determining inputs are connected to the first master outputs and the second master outputs. The at least one determining portion is configured to determine the determining outputs being the first master outputs or the second master outputs according to the at least one enable signal SE/seb.

In accordance with some embodiments of the present disclosure, the flip flop circuit 10 includes a first determining portion 13 and a second determining portion 14. The first determining portion 13 has first determining inputs 131, 131' and first determining outputs 132, 132'. The first determining inputs 131, 131' are connected to the first master outputs 112, 112'. The first determining outputs 132, 132' are connected to the determining outputs EO, EO', respectively. The second determining portion 14 has second determining inputs 141, 141' and second determining outputs 142, 142'. The second determining inputs 141, 141' are connected to the second master outputs 122, 122'. The second determining outputs 142, 142' are connected to the determining outputs EO, EO', respectively.

In accordance with some embodiments of the present disclosure, the at least one enable signal includes a scan enable signal (SE) and an inverted scan enable signal (seb).

In accordance with some embodiments of the present disclosure, the first determining portion 13 includes a plurality of transistors controlled by the scan enable signal (SE) and the inverted scan enable signal (seb). The second determining portion 14 includes a plurality of transistors controlled by the scan enable signal (SE) and the inverted scan enable signal (seb). Thus, the first determining portion 13 and the second determining portion 14 are configured to determine the determining outputs EO, EO' being the first master outputs 112, 112', respectively, or the second master outputs 122, 122', respectively, according to the scan enable signal (SE) and the inverted scan enable signal (seb). For example, when the scan enable signal (SE) is asserted to a logical high state (e.g., a logical "1"), the first determining portion 13 may couple the first master outputs 112, 112' to the first determining outputs 132, 132', respectively. The second determining portion 14 is deactivated. Therefore, the determining outputs EO, EO' are the first master outputs 112, 112', respectively. When the scan enable signal (SE) is asserted to a logical low state (e.g., a logical "0"), the second determining portion 14 may couple the second master outputs 122, 122' to the second determining outputs 142, 142' respectively. The first determining portion 13 is deactivated. Therefore, the determining outputs EO, EO' are the second master outputs 122, 122', respectively.

In accordance with some embodiments of the present disclosure, the determining outputs EO, EO' are connected to the slave inputs 151, 151' of the slave portion 15, respectively. The slave portion 15 is configured to generate an output signal 152 based on the slave inputs 151, 151' and the clock signal CP.

In accordance with some embodiments of the present disclosure, the OAPs of the first pair of cross-coupled Or-And-Inverter (OAI) logic gates 113 and the second pair of cross-coupled Or-And-Inverter (OAI) logic gates 123, and the AOI's of the pair of cross-coupled And-Or-Inverter (AOI) logic gates 153 may be activated complementarily in accordance with the clock signal CP. When the dock signal CP transitions from a low logical state to a high logical state (i.e., the dock signal CP at the high logical state), the first pair of cross-coupled Or-And-Inverter (OAI) logic gates 113 and the second pair of cross-coupled. Or-And-Inverter (OAI) logic gates 123 are activated and the pair of cross-coupled And-Or-Inverter (AOI) logic gates 153 is deactivated. As such, the first master portion 11 may latch the first input (scan-in signal) 111 to the output signal 152 or the second master portion 12 may latch the second input (data signal) 121 to the output signal 152 while the pair of cross-coupled And-Or-Inverter (AOI) logic gates 153 may serve as a transparent circuit. When the clock signal CP transitions from the high logical state to the low logical state (i.e., the clock signal CP at the low logical state), the first pair of cross-coupled Or-And-Inverter (OAI) logic gates 113 and the second pair of cross-coupled Or-And-Inverter (OAI) logic gates 123 are deactivated and, on the other hand, the pair of cross-coupled And-Or-Inverter (AOI) logic gates 153 is activated. As such, the slave portion 15 may directly latch either the first input (scan-in signal) 111 or the second input (data signal) 121 to the output signal 152 while the first master portion 11 and the second master portion 12 may serve as a transparent circuit.

In accordance with some embodiments of the present disclosure, by using the first pair of cross-coupled Or-And-Inverter (OAI) logic gates 113, the second pair of cross-coupled Or-And-Inverter (OAI) logic gates 123 and the pair of cross-coupled And-Or-Inverter (AOI) logic gates 153 in the flip-flop circuit 10, the clock signal CP of the flip-flop circuit 10 may be commonly used by the first pair of cross-coupled Or-And-Inverter (OAI) logic gates 113, the second pair of cross-coupled Or-And-Inverter (OAI) logic gates 123 and the pair of cross-coupled And-Or-Inverter (AOI) logic gates 153, respectively. As such, a logically inverted clock signal and corresponding components (e.g., one or more inverters) used to generate such a logically inverted dock signal may not be needed, which may advantageously reduce power consumption and design complexity of the flip-flop circuit 10. Further, as shown in FIG. 1, two OAI's in the first pair of cross-coupled Or-And-inverter (OAI) logic gates 113 are symmetric to each other, and two OAI's in the second pair of cross-coupled Or-And-Inverter (OAI) logic gates 123 are also symmetric to each other, and two AOI's in the pair of cross-coupled And-Or-Inverter (AOI) logic gates 153 are also symmetric to each other. By using such a symmetric characteristic of the cross-coupled OM's and AOI's of the flip-flop circuit 10, respectively, a number of transistors used to implement the OAI's and AOI's, respectively, may be substantially reduced compared to the conventional flip-flop circuit that uses a transmission gate. The reduced number of transistors may further reduce power consumption and design complexity of the flip-flop circuit 10.

In accordance with some embodiments of the present disclosure, by using the first determining portion 13 and the second determining portion 14, the first master outputs 112, 112' from the first master portion 11 or the second master outputs 122, 122' from the second master portion 12 may be determined. Therefore, a conventional multiplexer disposed before the convention master latch circuit may not be needed, which may advantageously make the speed of the flip-flop circuit 10 faster, for example, about 7%.

Figure 3:
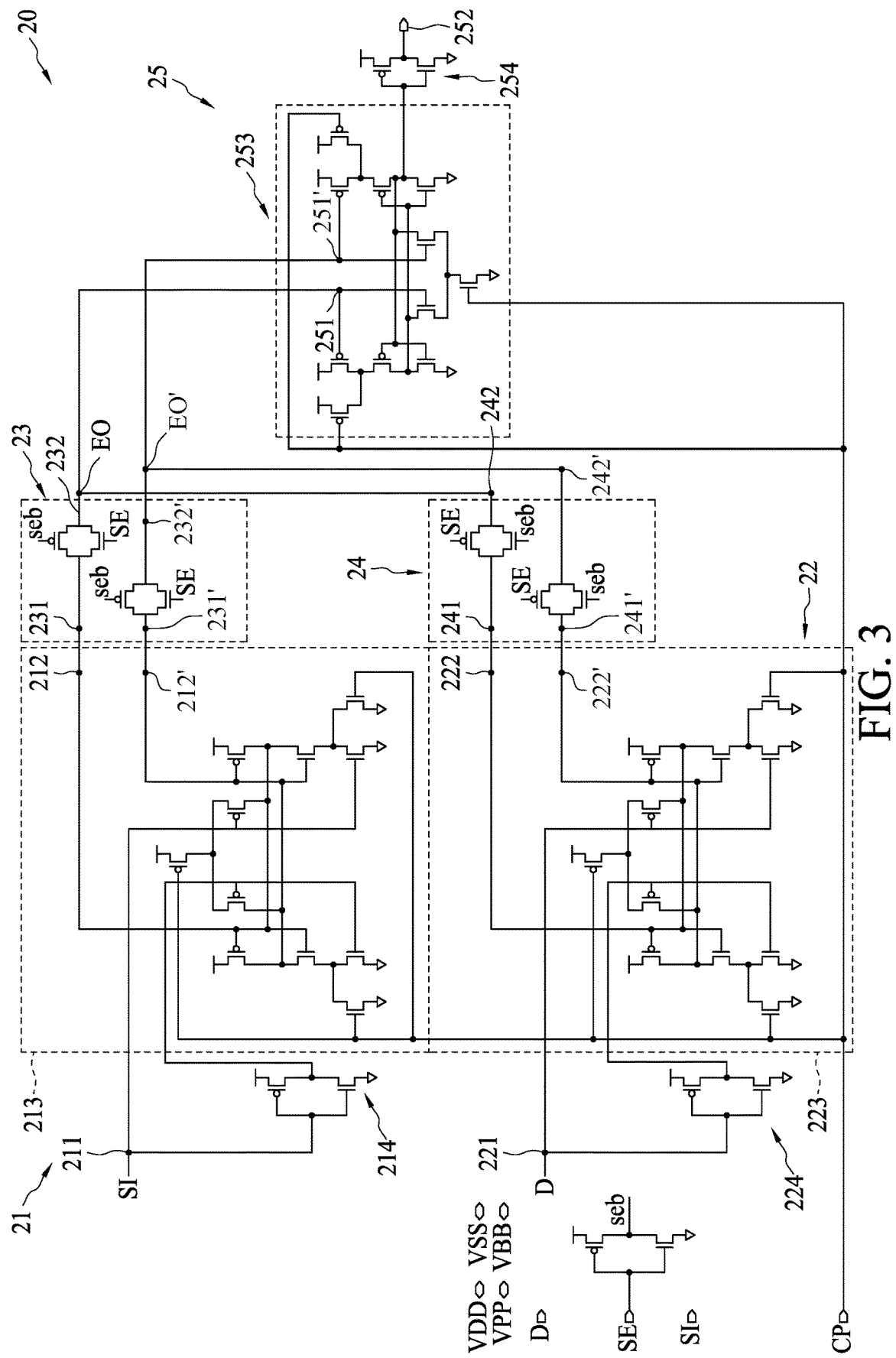
FIG. 3 illustrates a transistor-level circuit diagram of a flip flop circuit in accordance with some embodiments of the present disclosure.

FIG. 3 illustrates a transistor-level circuit diagram of a flip flop circuit in accordance with some embodiments of the present disclosure. Referring to FIG. 3, a flip flop circuit 20 includes a first master portion 21, a second master portion 22, a first determining portion 23, a second determining portion 24 and a slave portion 25. The first master portion 21 is configured to operate at a first mode and to receive a first input 211 and generate first master outputs 212, 212'. The second master portion 22 is configured to operate at a second mode and to receive a second input 221 and generate second master outputs 222, 222'. In accordance with some embodiments of the present disclosure, the first mode may be a testing mode, and the second mode may be a normal mode. The first input 211 may be a scan-in signal (SI) and the second input may 221 be a data signal (D). Referring to FIG. 1 and FIG. 3, each of the gate-level components (11, 12, and 15) of the flip-flop circuit 10 in FIG. 1 may be implemented by one or more transistors in FIG. 3. It is understood that the circuit diagram shown in FIG. 3 is merely an example to implement the gate-level components of the flip-flop circuit 10. Each of the gate-level components of the flip-flop circuit 10 may be implemented by any of a variety of circuit designs while remaining within the scope of the present disclosure.

In accordance with some embodiments of the present disclosure, the first master portion 21 includes a first pair of cross-coupled Or-And-Inverter (OAI) logic gates 213 and a first master inverter 214, and the second master portion 22 includes a second pair of cross-coupled Or-And-Inverter (OAI) logic gates 223 and a second master inverter 224, and the slave portion 25 includes a pair of cross-coupled And-Or-Inverter (AOI) logic gates 253 and a slave inverter 254. The first pair of cross-coupled Or-And-Inverter (OAI) logic gates 213 may be implemented by a plurality of transistors to perform the "OAI" logic function, and the first master inverter 214 may be implemented by two transistors to perform the "Inverter" logic function. For example, the two transistors of the first master inverter 214 are connected in series between a first supply voltage (e.g., Vdd) and a second supply voltage (e.g., ground). In some embodiments, one of the two transistors includes a p-type metal-oxide-semiconductor (PMOS) transistor, and the other transistor includes an n-type metal-oxide-semiconductor (NMOS) transistor. Furthermore, gates of the transistors are commonly coupled to the first input 211 (scan-in signal, SI), and a common node, coupled to respective drains of the transistors, is configured to provide signal that is logically inverted to the first input 211.

In accordance with some embodiments of the present disclosure, similarly, the second pair of cross-coupled Or-And-Inverter (OAI) logic gates 223 may be implemented by a plurality of transistors to perform the "OAI" logic function, and the second master inverter 224 may be implemented by two transistors to perform the "Inverter" logic function. Further, the pair of cross-coupled And-Or-Inverter (AOI) logic gates 253 may be implemented by a plurality of transistors to perform the "AOI" logic function, and the slave inverter 254 may be implemented by two transistors to perform the "Inverter" logic function.

In accordance with some embodiments of the present disclosure, the first determining portion 23 has first determining inputs 231, 213' and first determining outputs 232, 232'. The first determining inputs 231, 231' are connected to the first master outputs 212, 212', respectively. The first determining outputs 232, 232' are connected to the determining outputs EO, EO', respectively. The second determining portion 24 has second determining inputs 241, 241' and second determining outputs 242, 242'. The second determining inputs 241, 241' are connected to the second master outputs 222, 222', respectively. The second determining outputs 242, 242' are connected to the determining outputs EO, EO', respectively.

In accordance with some embodiments of the present disclosure, the first determining portion 23 includes a plurality of transistors controlled by the scan enable signal (SE) and the inverted scan enable signal (seb). The second determining portion 24 includes a plurality of transistors controlled by the scan enable signal (SE) and the inverted scan enable signal (seb). Thus, the first determining portion 23 and the second determining portion 24 are configured to determine the determining outputs EO, EO' being the first master outputs 212, 212', respectively, or the second master outputs 222, 222', respectively, according to the scan enable signal (SE) and the inverted scan enable signal (seb). For example, when the scan enable signal (SE) is asserted to a logical high state (e.g., a logical "1"), the first determining portion 23 may couple the first master outputs 212, 212' to the first determining outputs 232, 232', respectively. Therefore, the determining outputs EO, EO' are the first master outputs 212, 212', respectively. When the scan enable signal (SE) is asserted to a logical low state (e.g., a logical "0"), the second determining portion 24 may couple the second master outputs 222, 222' to the second determining outputs 242, 242', respectively. Therefore, the determining outputs EO, EO' are the second master outputs 222, 222', respectively.

In accordance with some embodiments of the present disclosure, the determining outputs EO, EO' are connected to the slave inputs 251, 251' of the slave portion 25. The slave portion 25 is configured to generate an output signal 252 based on the slave inputs 251, 251' and the clock signal CP.

In accordance with some embodiments of the present disclosure, by using the first determining portion 23 and the second determining portion 24, the first master outputs 212, 212' from the first master portion 21 or the second master outputs 222, 222' from the second master portion 22 may be determined. Therefore, a conventional multiplexer disposed before the convention master latch circuit may not be needed, which may advantageously make the speed of the flip-flop circuit 20 faster, for example, about 7%.

It is noted that the above-described and other structures described herein are exemplary and that the scope of this disclosure includes other examples. For example, Or-And-Inverter (OAI) logic gates may be implemented as depicted and described at 213, 223 or using other structures, such as those described in U.S. patent application Ser. No. 15/485,595, entitled "Low Power Flip Flop Circuit," or U.S. patent application Ser. No. 16/870,001, entitled "Low-Power AOI-Based Flip Flop," the entirety of both of which are incorporated by reference herein. And-Or-Inverter (AOI) logic gates may similarly be implemented as depicted herein or as described in the above-noted applications.

Figure 4:
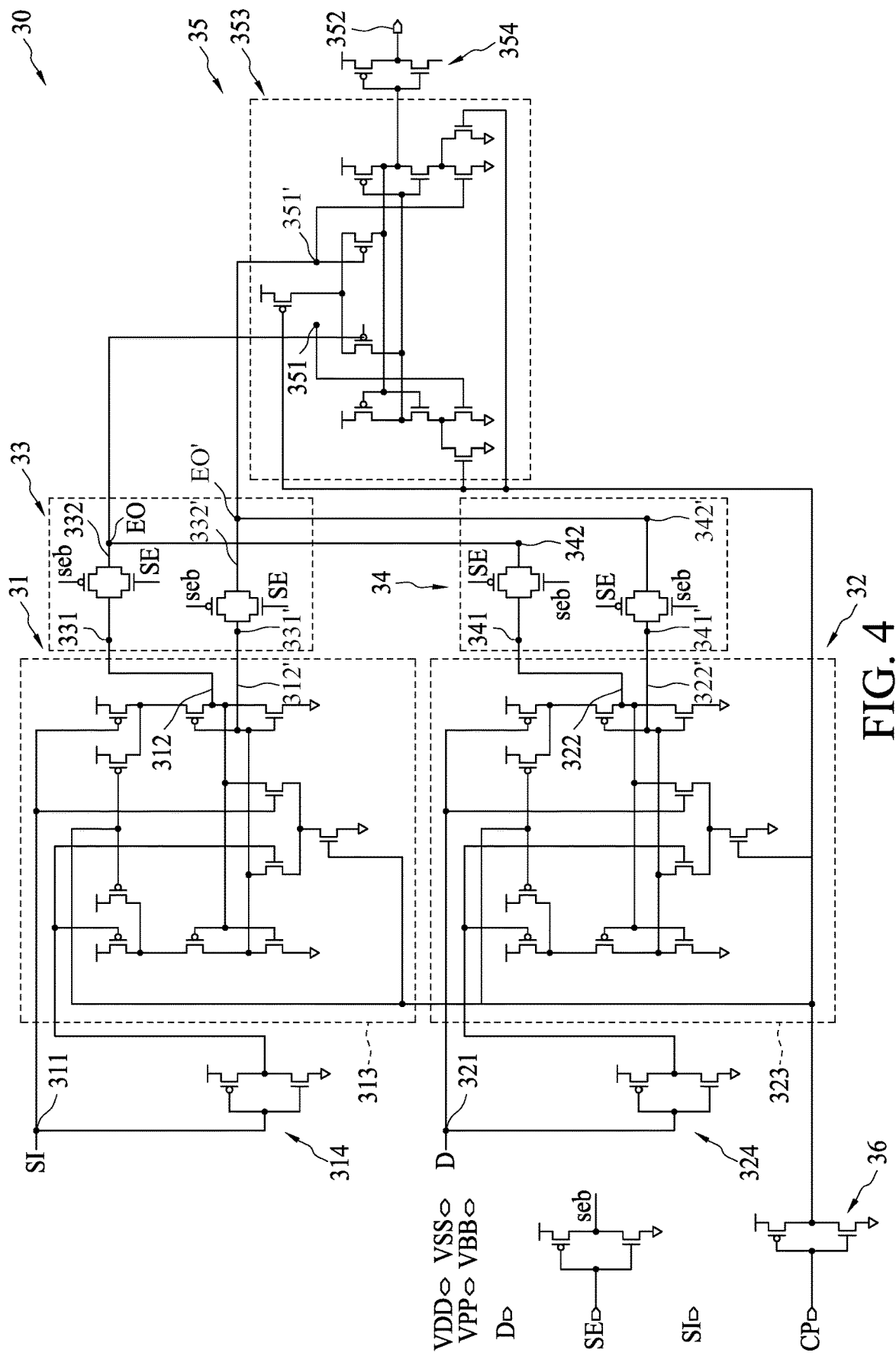
FIG. 4 illustrates a transistor-level circuit diagram of a flip flop circuit in accordance with some embodiments of the present disclosure.

FIG. 4 illustrates a transistor-level circuit diagram of a flip flop circuit in accordance with some embodiments of the present disclosure. Referring to FIG. 4, a flip flop circuit 30 includes a first master portion 31, a second master portion 32, a first determining portion 33, a second determining portion 34 and a slave portion 35. The first master portion 31 is configured to operate at a first mode and to receive a first input 311 and generate first master outputs 312, 312'. The second master portion 32 is configured to operate at a second mode and to receive a second input 321 and generate second master outputs 322, 322'. In accordance with some embodiments of the present disclosure, the first mode may be a testing mode, and the second mode may be a normal mode. The first input 311 may be a scan-in signal (SI) and the second input may 321 be a data signal (D).

In accordance with some embodiments of the present disclosure, the first master portion 31 includes a first pair of cross-coupled And-Or-Inverter (AOI) logic gates 313 and a first master inverter 314, and the second master portion 32 includes a second pair of cross-coupled And-Or-Inverter (AOI) logic gates 323 and a second master inverter 324, and the slave portion 35 includes a pair of cross-coupled Or-And-Inverter (OAI) logic gates 353 and a slave inverter 354. The first pair of cross-coupled And-Or-Inverter (AOI) logic gates 313 may be implemented by a plurality of transistors to perform the "AOI" logic function, and the first master inverter 314 may be implemented by two transistors to perform the "Inverter" logic function. Similarly, the second pair of cross-coupled And-Or-Inverter (AOI) logic gates 323 may be implemented by a plurality of transistors to perform the "AOI" logic function, and the second master inverter 324 may be implemented by two transistors to perform the "Inverter" logic function. Further, the pair of cross-coupled Or-And-Inverter (OAI) logic gates 353 may be implemented by a plurality of transistors to perform the "OAI" logic function, and the slave inverter 354 may be implemented by two transistors to perform the "Inverter" logic function.

In accordance with some embodiments of the present disclosure, referring to FIG. 3 and FIG. 4 the flip-flop circuit 30 is substantially similar to the flip-flop circuit 20 except that the first master portion 31 of the flip-flop circuit 30 includes the first pair of cross-coupled And-Or-Inverter (AOI) logic gates 313, the second master portion 32 of the flip-flop circuit 30 includes the second pair of cross-coupled And-Or-Inverter (AOI) logic gates 314, and the slave portion 35 of the flip-flop circuit 30 includes the pair of cross-coupled Or-And-Inverter (OAI) logic gates 353. In other words, the pair of cross-coupled Or-And-Inverter (OAI) logic gates 353 in FIG. 4 is substantially similar to the first pair of cross-coupled Or-And-Inverter (OAI) logic gates 213 or the second pair of cross-coupled Or-And-Inverter (OAI) logic gates 223 in FIG. 3. Furthermore, the first pair of cross-coupled And-Or-Inverter (AOI) logic gates 313 or the second pair of cross-coupled And-Or-Inverter (AOI) logic gates 323 in FIG. 4 is substantially similar to the pair of cross-coupled And-Or-Inverter (AOI) logic gates 253 in FIG. 3. Therefore, for clarity, discussions of the first master portion 31, the second master portion 32 and the slave portion 35 are omitted. By disposing the AOI's to the first master portion 31 and the second master portion 32 and the OAI's to the slave portion 35 (i.e., swapping the AOI's and OAI's), one or more additional clock buffer circuits can be integrated into the flip-flop circuit 30 thereby reducing a loading to a dock circuit (i.e., the circuit to provide the clock signal CP).

In accordance with some embodiments of the present disclosure, In order to implement the first master portion 31 and the second master portion 32 by the AOI's and the slave portion 35 by the OAI's, the flip-flop circuit 30 further includes an inverter 36 that is configured to receive the clock signal CP and provide a logically inverted signal to the first master portion 31 and the second master portion 32 and the slave portion 35, respectively.

In accordance with some embodiments of the present disclosure, the first determining portion 33 has first determining inputs 331, 331' and first determining outputs 332, 332'. The first determining inputs 331, 331' are connected to the first master outputs 312, 312', respectively. The first determining outputs 332, 332' are connected to the determining outputs EO, EO', respectively. The second determining portion 34 has second determining inputs 341, 341' and second determining outputs 342, 342'. The second determining inputs 341, 341' are connected to the second master outputs 322, 322', respectively. The second determining outputs 342, 342' are connected to the determining outputs EO, EO', respectively.

In accordance with some embodiments of the present disclosure, the first determining portion 33 includes a plurality of transistors controlled by the scan enable signal (SE) and the inverted scan enable signal (seb). The second determining portion 34 includes a plurality of transistors controlled by the scan enable signal (SE) and the inverted scan enable signal (seb). Thus, the first determining portion 33 and the second determining portion 34 are configured to determine the determining outputs EO, EO' being the first master outputs 312, 312', respectively, or the second master outputs 322, 322', respectively, according to the scan enable signal (SE) and the inverted scan enable signal (seb). For example, when the scan enable signal (SE) is asserted to a logical high state (e.g., a logical "1"), the first determining portion 33 may couple the first master outputs 312, 312' to the first determining outputs 332, 332', respectively. Therefore, the determining outputs EO, EO' are the first master outputs 312, 312', respectively. When the scan enable signal (SE) is asserted to a logical low state (e.g., a logical "0"), the second determining portion 34 may couple the second master outputs 322, 322' to the second determining outputs 342, 342', respectively. Therefore, the determining outputs EO, EO' are the second master outputs 322, 322', respectively.

In accordance with some embodiments of the present disclosure, by using the first determining portion 33 and the second determining portion 34, the first master outputs 312, 312' from the first master portion 31 or the second master outputs 322, 322' from the second master portion 32 may be determined. Therefore, a conventional multiplexer disposed before the convention master latch circuit may not be needed, which may advantageously make the speed of the flip-flop circuit 30 faster, for example, about 7%.

Figure 5:
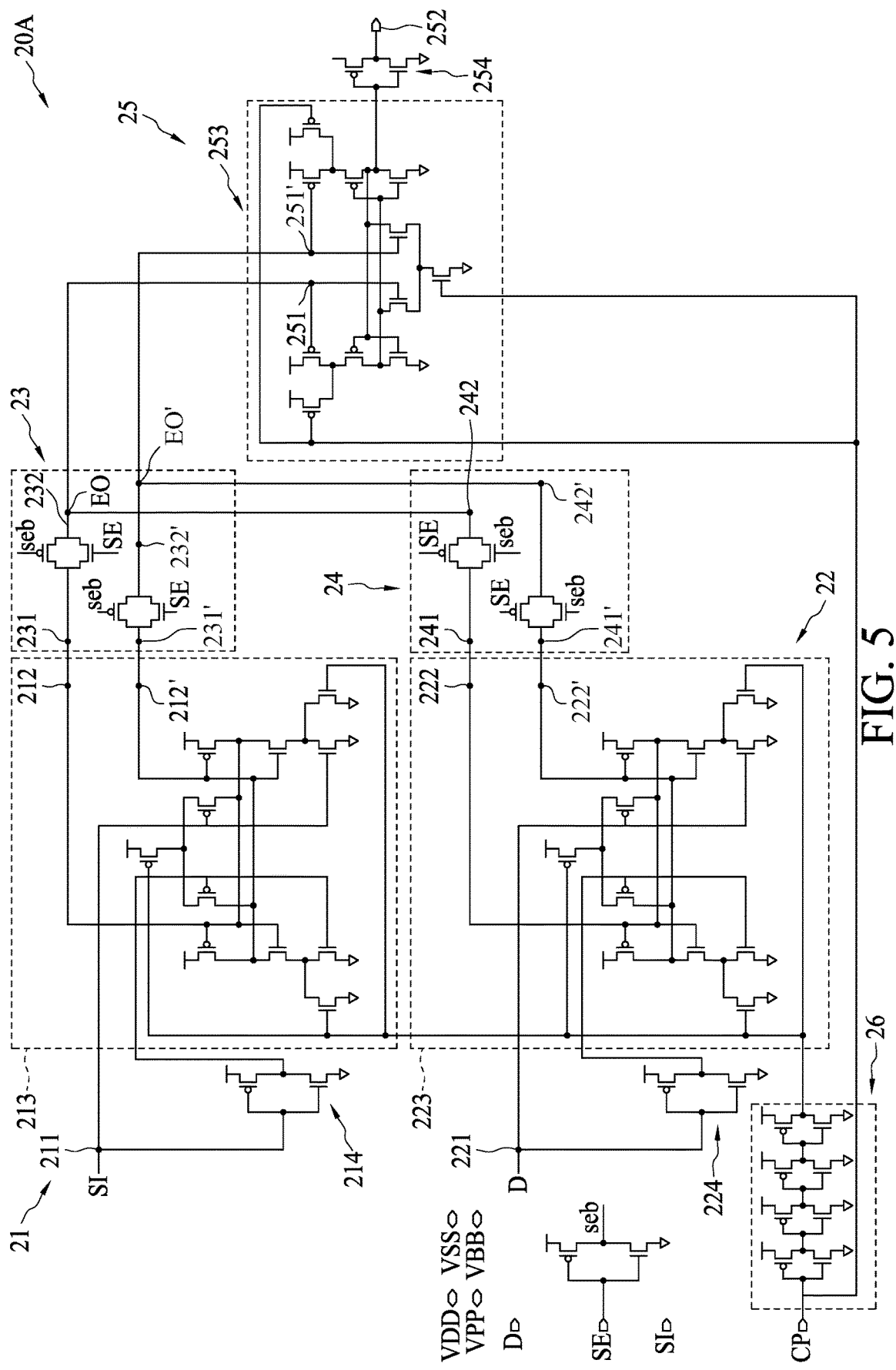
FIG. 5 illustrates a transistor-level circuit diagram of a flip flop circuit in accordance with some embodiments of the present disclosure.

FIG. 5 illustrates a transistor-level circuit diagram of a flip flop circuit in accordance with some embodiments of the present disclosure. Referring to FIG. 3 and FIG. 5, as shown, the flip-flop circuit 20A is substantially similar to the flip-flop circuit 20 of FIG. 3 except that the flip-flop circuit 20A further includes a time-borrowing circuit 26. The time-borrowing portion 26 is coupled to the first master portion 21 and the second master portion 22 for delaying a predetermined time of the clock signal CP to the first master portion 21 and the second master portion 22, and the clock signal CP is connected to the slave portion 25 without the time-borrowing portion 26. For clarity, discussions of the components of the flip-flop circuit 20A that are substantially similar to those of the flip-flop circuit 20, e.g., 21, 22, and 25, are omitted.

In accordance with some embodiments of the present disclosure, the time-borrowing circuit 26 includes one or more inverters that are serially coupled to one another. Although the illustrated embodiment of FIG. 5 shows the time-borrowing circuit 26 includes 4 inverters, any desired number (e.g., 2~8) of inverters may be included in the time-borrowing circuit 26 while remaining within the scope of the present disclosure. Including such a time-borrowing circuit 26 in the flip-flop circuit 20A may delay the clock signal CP to be received by the first master portion 21 and the second master portion 22 by a number of gate delays that corresponds to a number of the inverters included in the time-borrowing circuit 26, while the slave portion 25 receives the clock signal CP without a delay. In accordance with some embodiments of the present disclosure, delaying the clock signal CP to the first master portion 21 and the second master portion 22 may advantageously reduce a setup time of the flip-flop circuit 20A. Since the clock signal CP is delayed to be received by the first master portion 21 and the second master portion 22 and the clock signal CP is immediately received by the slave portion 25 without a delay, in some embodiments, the slave portion 25 may provide a transparent window and release data earlier, which causes the first master portion 21 and the second master portion 22 to have more time for receiving input data during a current cycle, which in turn reduces the setup time.

In accordance with some embodiments of the present disclosure, the time-borrowing circuit 26 includes 4 inverters, and each inverter of the time-borrowing circuit 26 is substantially similar to the inverters 214, 224, and 252. Thus, for brevity, discussions for the inverter(s) of the time-borrowing circuit 26 will be omitted. As such, the delayed clock signal received by the first master portion 21 and the second master portion 22 may have about four gate delays behind the clock signal CP.

Figure 6:
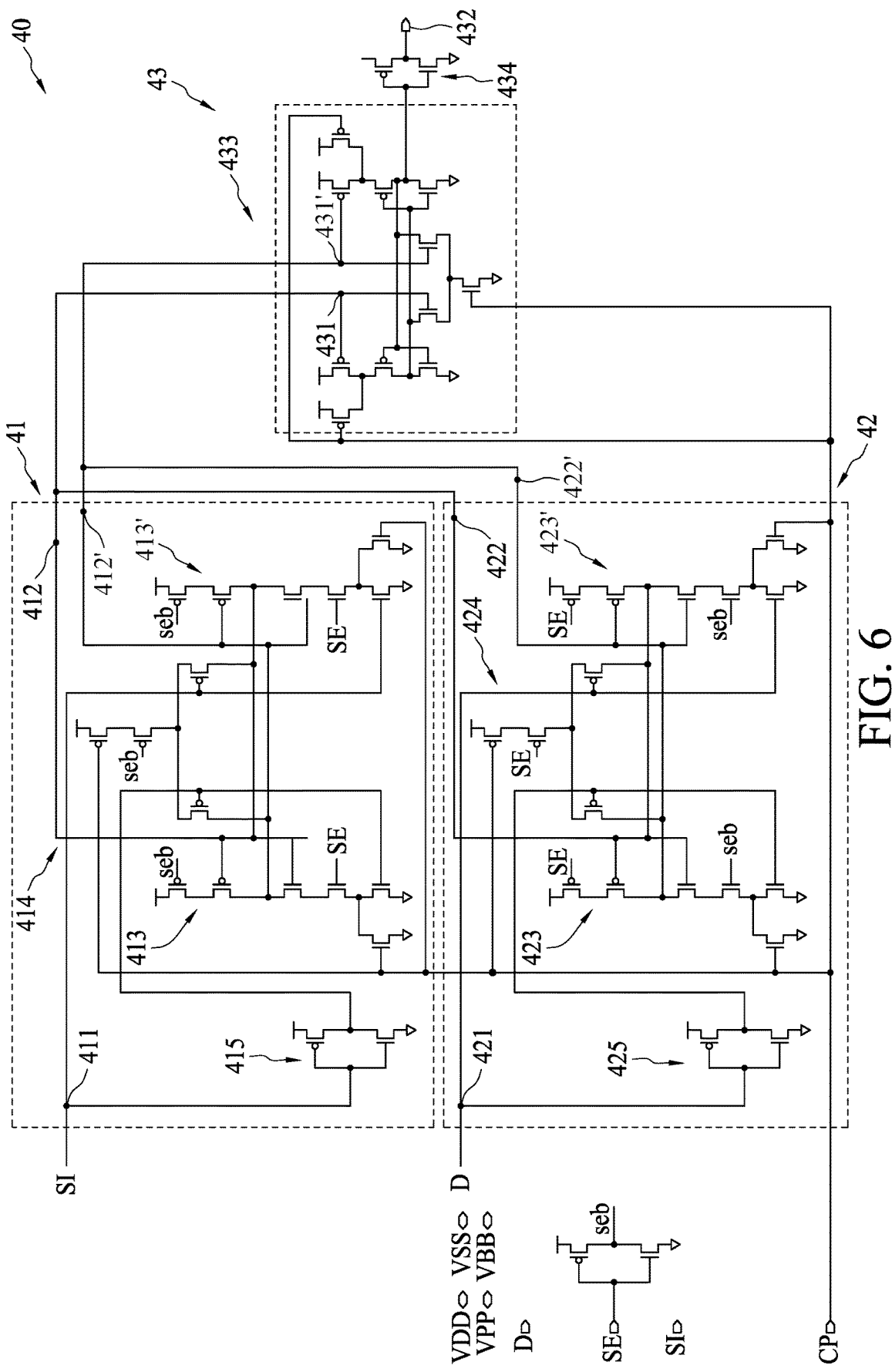
FIG. 6 illustrates a transistor-level circuit diagram of a flip flop circuit in accordance with some embodiments of the present disclosure.

FIG. 6 illustrates a transistor-level circuit diagram of a flip flop circuit in accordance with some embodiments of the present disclosure. Referring to FIG. 6, a flip flop circuit 40 includes a first master portion 41, a second master portion 42, and a slave portion 43. The first master portion 41 is configured to operate at a first mode and to receive a first input 411 and generate first master outputs 412, 412'. The second master portion 42 is configured to operate at a second mode and to receive a second input 421 and generate second master outputs 422, 422'. In accordance with some embodiments of the present disclosure, the first mode may be a testing mode, and the second mode may be a normal mode. The first input 411 may be a scan-in signal (SI) and the second input 421 may be a data signal (D).

In accordance with some embodiments of the present disclosure, when the first master portion 41 operates under the testing mode, the first master portion 41 receives the scan-in signal 411 and generates the first master outputs 412, 412' (scan-out signal). in some embodiments, fault(s) of one or more flip-flop circuits (i.e., one or more malfunctioning flip-flop circuits) may be detected by comparing one or more differences between the scan-in signal 411 and the scan-out signal 412, 412'. And such a malfunctioning flip-flop circuit may be used to pinpoint which corresponding subset of logic gates are malfunctioning. In accordance with some embodiments of the present disclosure, the first master portion 41 has a first enable part 413 for enabling the first master portion 41 according to at least one enable signal. The at least one enable signal includes a scan enable signal (SE) and an inverted scan enable signal (seb).

In accordance with some embodiments of the present disclosure, when the second master portion 42 operates under the normal mode, the second master portion 42 receives the data signal 421 provided from the respective subset of logic gates of the to-be tested circuit. In accordance with some embodiments of the present disclosure, the data signal 421 may include data generated based on logic operations of the respective subset of logic gates. In accordance with some embodiments of the present disclosure, the second master portion 42 has a second enable part 423 for enabling the second master portion 42 according to the at least one enable signal. The at least one enable signal includes a scan enable signal (SE) and an inverted scan enable signal (seb).

In accordance with some embodiments of the present disclosure, the slave portion 43 is configured to receive the first master outputs 412, 412' or the second master outputs 422, 422' and generate an output signal 432. The slave portion 43 includes slave inputs 431, 431' connected to the first master outputs 412, 412', respectively, and the second master outputs 422, 422', respectively.

In accordance with some embodiments of the present disclosure, the first master portion 41 includes a first pair of cross-coupled Or-And-Inverter (OAI) logic gates 414 and a first master inverter 415, and the second master portion 42 includes a second pair of cross-coupled Or-And-Inverter (OAI) logic gates 424 and a second master inverter 425, and the slave portion 43 includes a pair of cross-coupled And-Or-Inverter (AOI) logic gates 433 and a slave inverter 434.

In accordance with some embodiments of the present disclosure, the first enable part 413 includes a plurality of transistors controlled by the scan enable signal (SE) and the inverted scan enable signal (seb) to enable the first master portion 41. The first enable part 413 is disposed in the first master portion 41. The second enable part 423 includes a plurality of transistors controlled by the scan enable signal (SE) and the inverted scan enable signal (seb) to enable the second master portion 42. The second enable part 423 is disposed in the second master portion 42. Thus, the first enable part 413 and the second enable part 423 are configured to determine the slave inputs 431, 431' being the first master outputs 412, 412', respectively, or the second master outputs 422, 422', respectively, according to the scan enable signal (SE) and the inverted scan enable signal (seb). For example, when the scan enable signal (SE) is asserted to a logical high state (e.g., a logical "1"), the first pair of cross-coupled Or-And-Inverter (OAI) logic gates 414 is activated and the second pair of cross-coupled Or-And-Inverter (OAI) logic gates 424 is deactivated. Therefore, the slave inputs 431, 431' are the first master outputs 412, 412', respectively. When the scan enable signal (SE) is asserted to a logical low state (e.g., a logical "0"), the first pair of cross-coupled Or-And-Inverter (OAI) logic gates 414 is deactivated and the second pair of cross-coupled Or-And-Inverter (OAI) logic gates 424 is activated. Therefore, the slave inputs 431, 431' are the second master outputs 422, 422', respectively.

In accordance with some embodiments of the present disclosure, by using the first enable part 413 and the second enable part 423, the first master outputs 412, 412' from the first master portion 41 or the second master outputs 422, 422' from the second master portion 42 may be determined to transmit to the slave inputs 431. Therefore, a conventional multiplexer disposed before the convention master latch circuit may not be needed, which may advantageously improve the performance of the flip-flop circuit 40.

Figure 7:
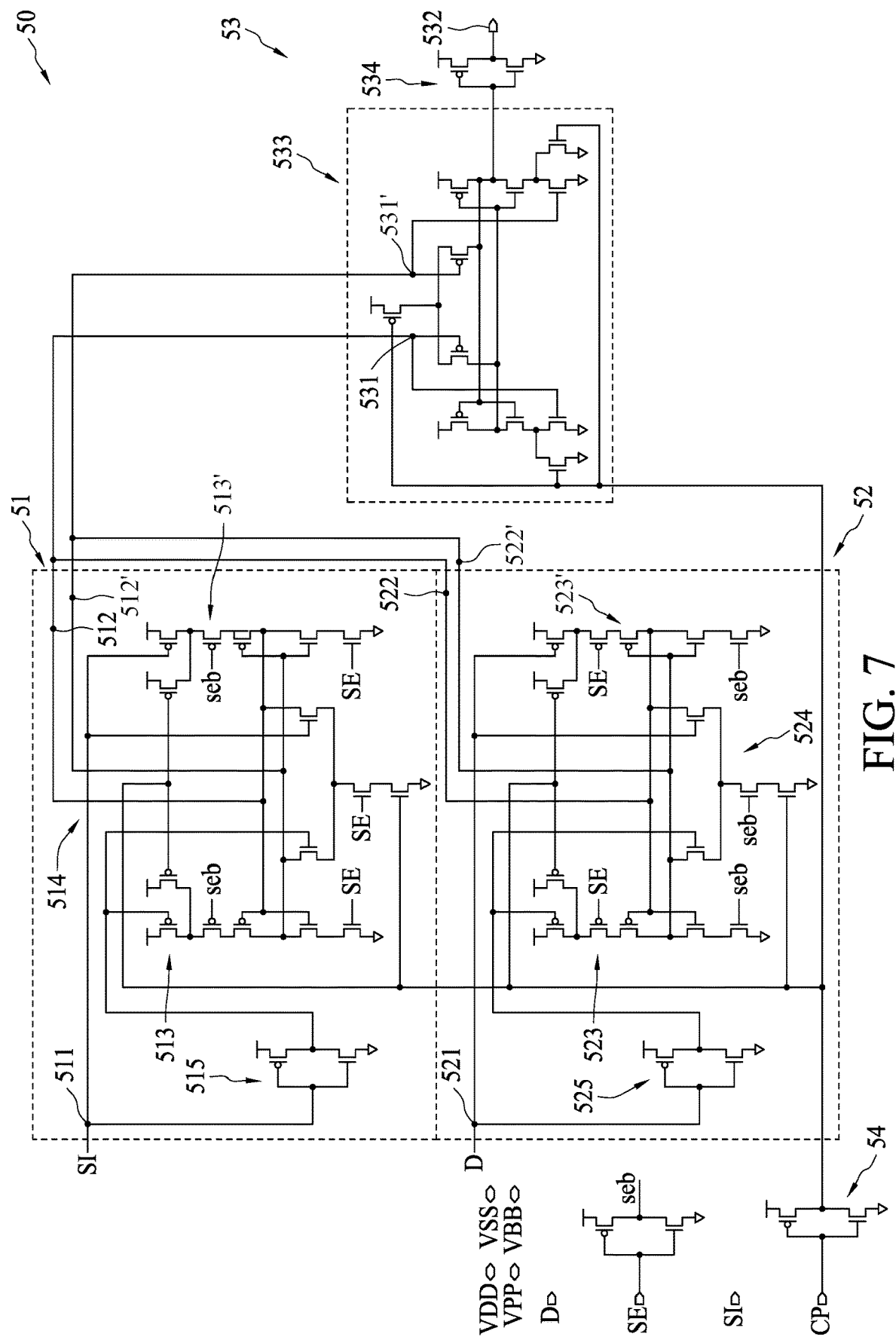
FIG. 7 illustrates a transistor-level circuit diagram of a flip flop circuit in accordance with some embodiments of the present disclosure.

FIG. 7 illustrates a transistor-level circuit diagram of a flip flop circuit in accordance with some embodiments of the present disclosure. Referring to FIG. 7, a flip flop circuit 50 includes a first master portion 51, a second master portion 52, and a slave portion 53. The first master portion 51 is configured to operate at a first mode and to receive a first input 511 and generate first master outputs 512, 512'. The second master portion 52 is configured to operate at a second mode and to receive a second input 521 and generate second master outputs 522, 522'. In accordance with some embodiments of the present disclosure, the first mode may be a testing mode, and the second mode may be a normal mode. The first input 511 may be a scan-in signal (SI) and the second input 421 may be a data signal (D).

In accordance with some embodiments of the present disclosure, the first master portion 51 includes a first pair of cross-coupled And-Or-Inverter (AOI) logic gates 514 and a first master inverter 515, and the second master portion 52 includes a second pair of cross-coupled And-Or-Inverter (AOI) logic gates 524 and a second master inverter 525, and the slave portion 53 includes a pair of cross-coupled Or-And-Inverter (OAI) logic gates 533 and a slave inverter 534.

The first pair of cross-coupled And-Or-Inverter (AOI) logic gates 514 may be implemented by a plurality of transistors to perform the "AOI" logic function, and the first master inverter 515 may be implemented by two transistors to perform the "Inverter" logic function. Similarly, the second pair of cross-coupled And-Or-Inverter (AOI) logic gates 524 may be implemented by a plurality of transistors to perform the "AOI" logic function, and the second master inverter 525 may be implemented by two transistors to perform the "Inverter" logic function. Further; the pair of cross-coupled Or-And-Inverter (OAI) logic gates 533 may be implemented by a plurality of transistors to perform the "OAI" logic function, and the slave inverter 534 may be implemented by two transistors to perform the "Inverter" logic function.

In accordance with some embodiments of the present disclosure, referring to FIG. 6 and FIG. 7, the flip-flop circuit 50 is substantially similar to the flip-flop circuit 40 except that the first master portion 51 of the flip-flop circuit 50 includes the first pair of cross-coupled And-Or-Inverter (AOI) logic gates 514 the second master portion 52 of the flip-flop circuit 50 includes the second pair of cross-coupled And-Or-Inverter (AOI) logic gates 524, and the slave portion 53 of the flip-flop circuit 50 includes the pair of cross-coupled Or-And-Inverter (OAI) logic gates 533. In other words, the pair of cross-coupled Or-And-Inverter (OAI) logic gates 533 in FIG. 7 is substantially similar to the first pair of cross-coupled Or-And-Inverter (OAI) logic gates 414 or the second pair of cross-coupled Or-And-Inverter (OAI) logic gates 424 in FIG. 6. Furthermore, the first pair of cross-coupled And-Or-Inverter (AOI) logic gates 514 or the second pair of cross-coupled And-Or-Inverter (AOI) logic gates 524 in FIG. 7 is substantially similar to the pair of cross-coupled And-Or-Inverter (AOI) logic gates 433 in FIG. 6. Therefore, for clarity, discussions of the first master portion 51, the second master portion 52 and the slave portion 55 are omitted. By disposing the AOI's to the first master portion 51 and the second master portion 52 and the OAI's to the slave portion 53 (i.e., swapping the AOI's and OAI's), one or more additional clock buffer circuits can be integrated into the flip-flop circuit 50 thereby reducing a loading to a dock circuit (i.e., the circuit to provide the clock signal CP).

In accordance with some embodiments of the present disclosure, In order to implement the first master portion 51 and the second master portion 52 by the AOI's and the slave portion 53 by the OAI's, the flip-flop circuit 50 further includes an inverter 54 that is configured to receive the clock signal CP and provide a logically inverted signal to the first master portion 51 and the second master portion 52 and the slave portion 53, respectively.

In accordance with some embodiments of the present disclosure, the first master portion 51 has a first enable part 513 for enabling the first master portion 51 according to at least one enable signal. In accordance with some embodiments of the present disclosure, the second master portion 52 has a second enable part 523 for enabling the second master portion 52 according to the at least one enable signal. The at least one enable signal includes a scan enable signal (SE) and an inverted scan enable signal (seb).

In accordance with some embodiments of the present disclosure, the slave portion 53 is configured to receive the first master outputs 512, 512' or the second master outputs 522, 522' and generate an output signal 532. The slave portion 53 includes slave inputs 531, 531' connected to the first master outputs 512, 512', respectively, and the second master outputs 522, 522', respectively.

In accordance with some embodiments of the present disclosure, the first enable part 513 includes a plurality of transistors controlled by the scan enable signal (SE) and the inverted scan enable signal (seb) to enable the first master portion 51. The first enable part 513 is disposed in the first master portion 51. The second enable part 523 includes a plurality of transistors controlled by the scan enable signal (SE) and the inverted scan enable signal (seb) to enable the second master portion 52. The second enable part 523 is disposed in the second master portion 52. Thus, the first enable part 513 and the second enable part 523 are configured to determine the slave inputs 531, 531' being the first master outputs 512, 512', respectively, or the second master outputs 522, 522' respectively, according to the scan enable signal (SE) and the inverted scan enable signal (seb). For example, when the scan enable signal (SE) is asserted to a logical high state (e.g., a logical "1"), the first pair of cross-coupled Or-And-Inverter (OAI) logic gates 514 is activated and the second pair of cross-coupled Or-And-Inverter (OAI) logic gates 524 is deactivated. Therefore, the slave inputs 531, 531' are the first master outputs 512, 512', respectively. When the scan enable signal (SE) is asserted to a logical low state (e.g., a logical "0"), the first pair of cross-coupled Or-And-Inverter (OAI) logic gates 514 is deactivated and the second pair of cross-coupled Or-And-inverter (OM) logic gates 524 is activated. Therefore, the slave inputs 531, 531' are the second master outputs 522, 522', respectively.

In accordance with some embodiments of the present disclosure, by using the first enable part 513 and the second enable part 523, the first master outputs 512, 512' from the first master portion 51 or the second master outputs 522, 522' from the second master portion 52 may be determined to transmit to the slave inputs 531, 531', respectively. Therefore, a conventional multiplexer disposed before the convention master latch circuit may not be needed, which may advantageously improve the performance of the flip-flop circuit 50.

Figure 8:
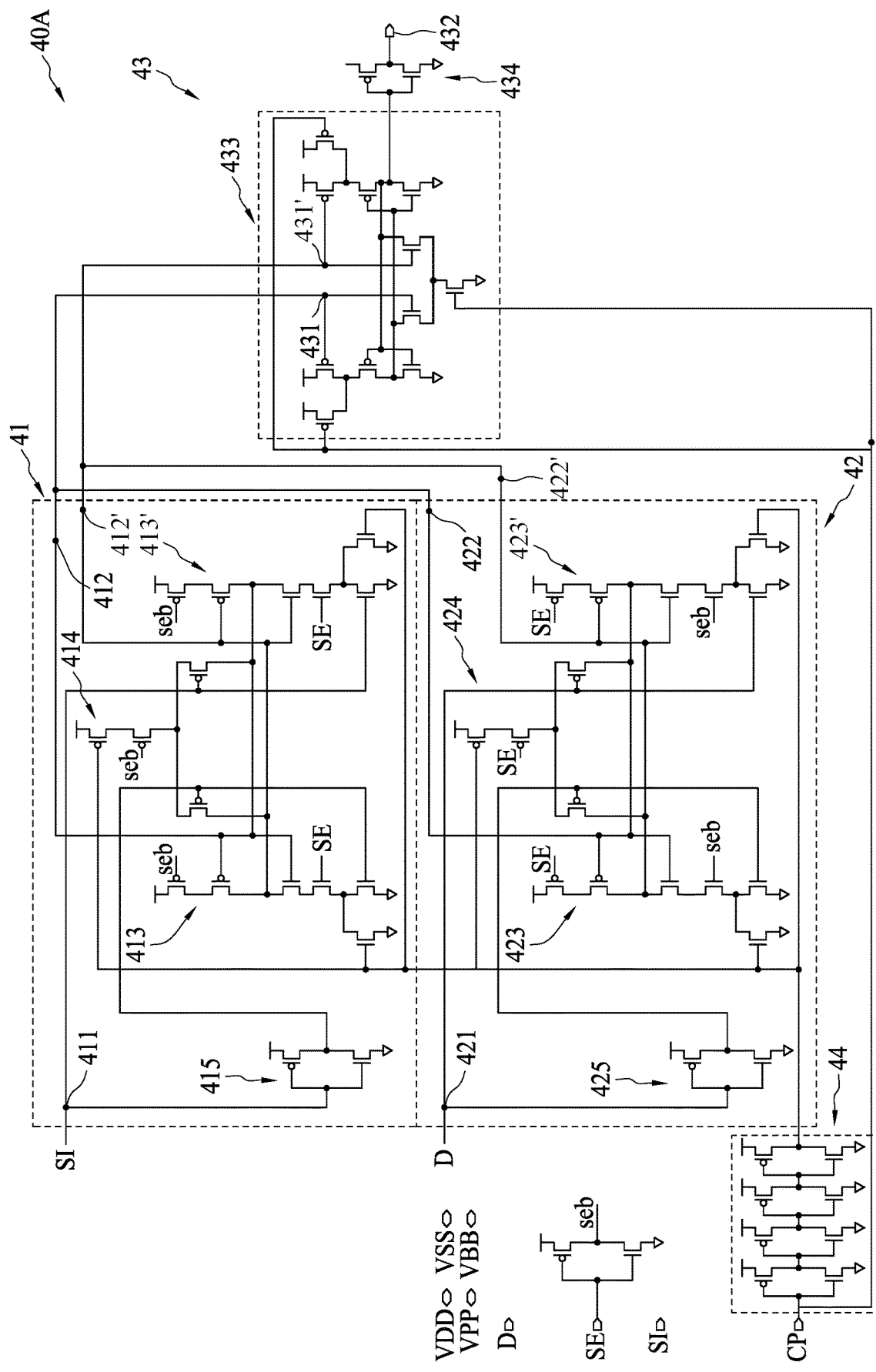
FIG. 8 illustrates a transistor-level circuit diagram of a flip flop circuit in accordance with some embodiments of the present disclosure.

FIG. 8 illustrates a transistor-level circuit diagram of a flip flop circuit in accordance with some embodiments of the present disclosure. Referring to FIG. 6 and FIG. 8, as shown, the flip-flop circuit 40A is substantially similar to the flip-flop circuit 40 of FIG. 6 except that the flip-flop circuit 40A further includes a time-borrowing circuit 44. The time-borrowing portion 44 is coupled to the first master portion 41 and the second master portion 42 for delaying a predetermined time of the clock signal CP to the first master portion 41 and the second master portion 42, and the clock signal CP is connected to the slave portion 43 without the time-borrowing portion 44. For clarity, discussions of the components of the flip-flop circuit 40A that are substantially similar to those of the flip-flop circuit 40, e.g., 41, 42, and 43, are omitted.

In accordance with some embodiments of the present disclosure, the time-borrowing circuit 44 includes one or more inverters that are serially coupled to one another. Although the illustrated embodiment of FIG. 8 shows the time-borrowing circuit 44 includes 4 inverters, any desired number (e.g., 2~8) of inverters may be included in the time-borrowing circuit 44 while remaining within the scope of the present disclosure. Including such a time-borrowing circuit 44 in the flip-flop circuit 40A may delay the clock signal CP to be received by the first master portion 41 and the second master portion 42 by a number of gate delays that corresponds to a number of the inverters included in the time-borrowing circuit 44, while the slave portion 43 receives the clock signal CP without a delay. In accordance with some embodiments of the present disclosure, delaying the clock signal CP to the first master portion 41 and the second master portion 42 may advantageously reduce a setup time of the flip-flop circuit 40A. Since the clock signal CP is delayed to be received by the first master portion 41 and the second master portion 42 and the clock signal CP is immediately received by the slave portion 43 without a delay, in some embodiments, the slave portion 43 may provide a transparent window and release data earlier, which causes the first master portion 41 and the second master portion 42 to have more time for receiving input data during a current cycle, which in turn reduces the setup time.

In accordance with some embodiments of the present disclosure, the time-borrowing circuit 44 includes 4 inverters, and each inverter of the time-borrowing circuit 44 is substantially similar to the inverters 415, 425, and 434. Thus, for brevity, discussions for the inverter(s) of the time-borrowing circuit 44 will be omitted. As such, the delayed clock signal received by the first master portion 41 and the second master portion 42 may have about four gate delays behind the clock signal CP.

Figure 9:
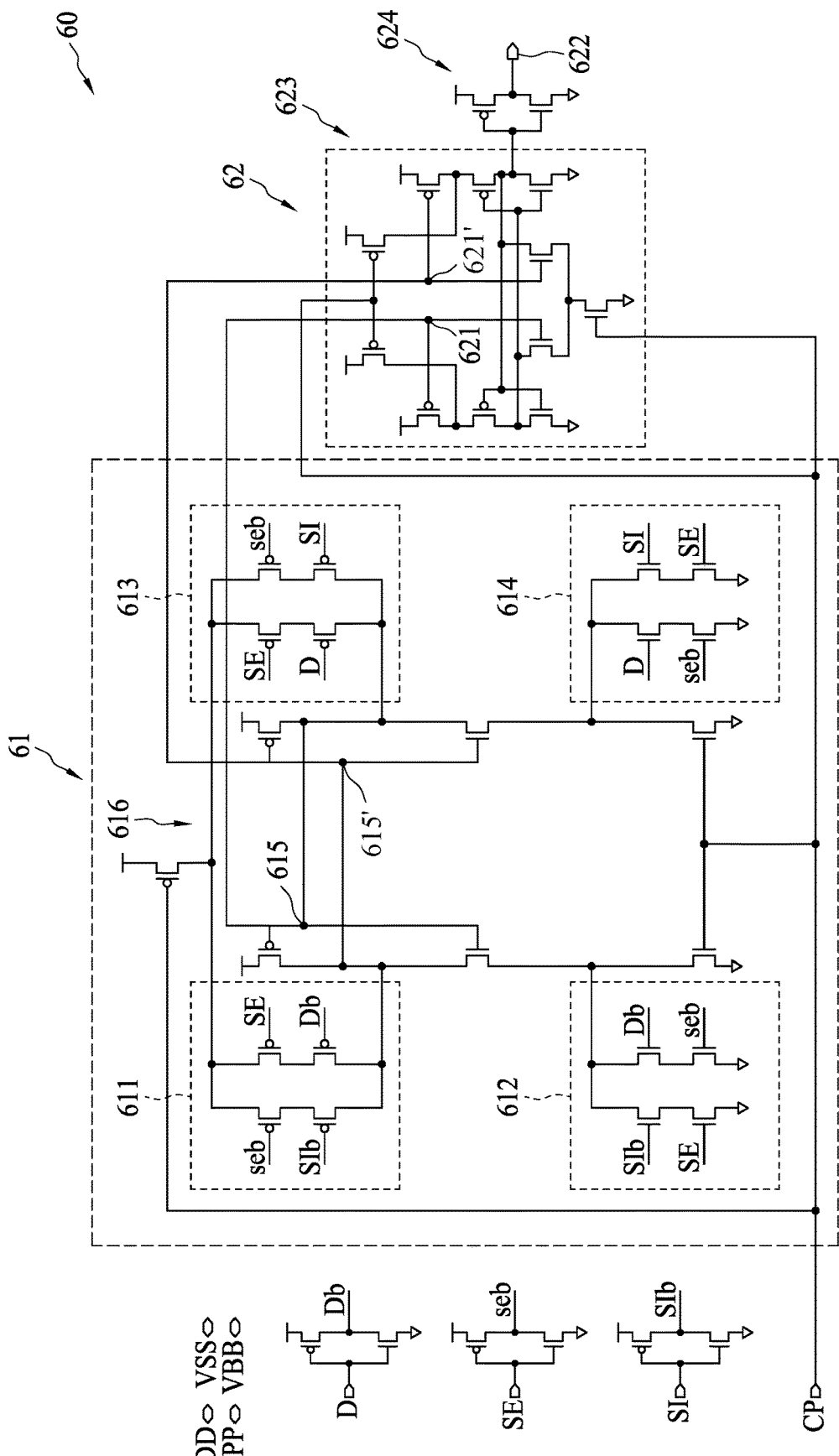
FIG. 9 illustrates a transistor-level circuit diagram of a flip flop circuit in accordance with some embodiments of the present disclosure.

FIG. 9 illustrates a transistor-level circuit diagram of a flip flop circuit in accordance with some embodiments of the present disclosure. Referring to FIG. 9, a flip flop circuit 60 includes a master portion 61, and a slave portion 62. The master portion 61 is configured to receive at least one first input, at least one second input and at least one enable signal, and generate master outputs 615, 615'. The master portion 61 includes a plurality of controlling part 611, 612, 613, 614 configured to control the master portion 61 to operate at a first mode or a second mode according to the at least one first input, the at least one second input and the at least one enable signal. In accordance with some embodiments of the present disclosure, the first mode may be a testing mode, and the second mode may be a normal mode. The at least one first input include a scan-in signal (SI) and an inverted scan-in signal (SIb), and the at least one second input include a data signal (D) and an inverted data signal (Db). The at least one enable signal include a scan enable signal (SE) and an inverted scan enable signal (seb).

In accordance with some embodiments of the present disclosure, the slave portion 62 is configured to receive the master outputs 615, 615' and generate an output signal 622. The slave portion 62 includes slave inputs 621, 621' connected to the master outputs 615, 615', respectively.

In accordance with some embodiments of the present disclosure, the master portion 61 includes a first controlling part 611, a second controlling part 612, a third controlling part 613 and a fourth controlling part 614. The first controlling part 611 includes a plurality of transistors controlled by the inverted scan-in signal (SIb), the inverted data signal (Db), the scan enable signal (SE) and the inverted scan enable signal (SEb). That is, the first controlling part 611 may include four PMOS transistors having gates controlled by the inverted scan-in signal (SIb), the inverted data signal (Db), the scan enable signal (SE) and the inverted scan enable signal (seb), respectively. The second controlling part 612 includes a plurality of transistors controlled by the inverted scan-in signal (SIb), the inverted data signal (Db), the scan enable signal (SE) and the inverted scan enable signal (seb). That is, the second controlling part 612 may include four NMOS transistors having gates controlled by the inverted scan-in signal (SIb), the inverted data signal (Db), the scan enable signal (SE) and the inverted scan enable signal (seb), respectively. The third controlling part 613 includes a plurality of transistors controlled by the scan-in signal (SI), the data signal (D), the scan enable signal (SE) and the inverted scan enable signal (seb). That is, the third controlling part 613 may include four PMOS transistors having gates controlled by the scan-in signal (SI), the data signal (D), the scan enable signal (SE) and the inverted scan enable signal (seb), respectively. The fourth controlling part 614 may include a plurality of transistors controlled by the scan-in signal (SI), the data signal (D), the scan enable signal (SE) and the inverted scan enable signal (seb). That is, the fourth controlling part 614 may include four NMOS transistors having gates controlled by the scan-in signal (SI), the data signal (D), the scan enable signal (SE) and the inverted scan enable signal (seb), respectively.

In accordance with some embodiments of the present disclosure, the master portion 61 includes a pair of cross-coupled Or-And-Inverter (OAI) logic gates 616, and the slave portion 62 includes a pair of cross-coupled And-Or-Inverter (AOI) logic gates 623 and a slave inverter 624. The pair of cross-coupled Or-And-inverter (OAI) logic gates 616 may be implemented by a plurality of transistors to perform the "OAI" logic function. Further, the pair of cross-coupled And-Or-Inverter (AOI) logic gates 623 may be implemented by a plurality of transistors to perform the "AOI" logic function, and the slave inverter 624 may be implemented by two transistors to perform the "Inverter" logic function.

In accordance with some embodiments of the present disclosure, the first controlling part 611, the second controlling part 612, the third controlling part 613 and the fourth controlling part 614 may determine the master portion 61 to operate at the testing mode or the normal mode. When the master portion 61 operates under the testing mode, the scan enable signal (SE) is asserted to a logical high state (e.g., a logical "1"), and the scan-in signal (SI) and the inverted scan-in signal (SIb) are inputted to the pair of cross-coupled Or-And-Inverter (OAI) logic gates 616. Therefore, the master portion 61 generates the master outputs 615, 615' (scan-out signal). When the master portion 61 operates under the normal mode, the scan enable signal (SE) is asserted to a logical low state (e.g., a logical "0"), and the data signal (D) and the inverted data signal (Db) are inputted to the pair of cross-coupled Or-And-Inverter (OAI) logic gates 616.

In accordance with some embodiments of the present disclosure, the dock signal CP of the flip-flop circuit 60 may be commonly used by the pair of cross-coupled Or-And-Inverter (OAI) logic gates 616 and the pair of cross-coupled And-Or-Inverter (AOI) logic gates 623, respectively. As such, a logically inverted clock signal and corresponding components (e.g., one or more inverters) used to generate such a logically inverted clock signal may not be needed, which may advantageously reduce power consumption and design complexity of the flip-flop circuit 60.

In accordance with some embodiments of the present disclosure, by using the first controlling part 611, the second controlling part 612, the third controlling part 613 and the fourth controlling part 614, the master portion 61 may operate at the testing mode or the normal mode. Therefore, a conventional multiplexer disposed before the convention master latch circuit may not be needed, which may advantageously make the speed of the flip-flop circuit 60 faster, and reduce the power consumption of the flip-flop circuit 60, for example, about 17%.

Figure 10:
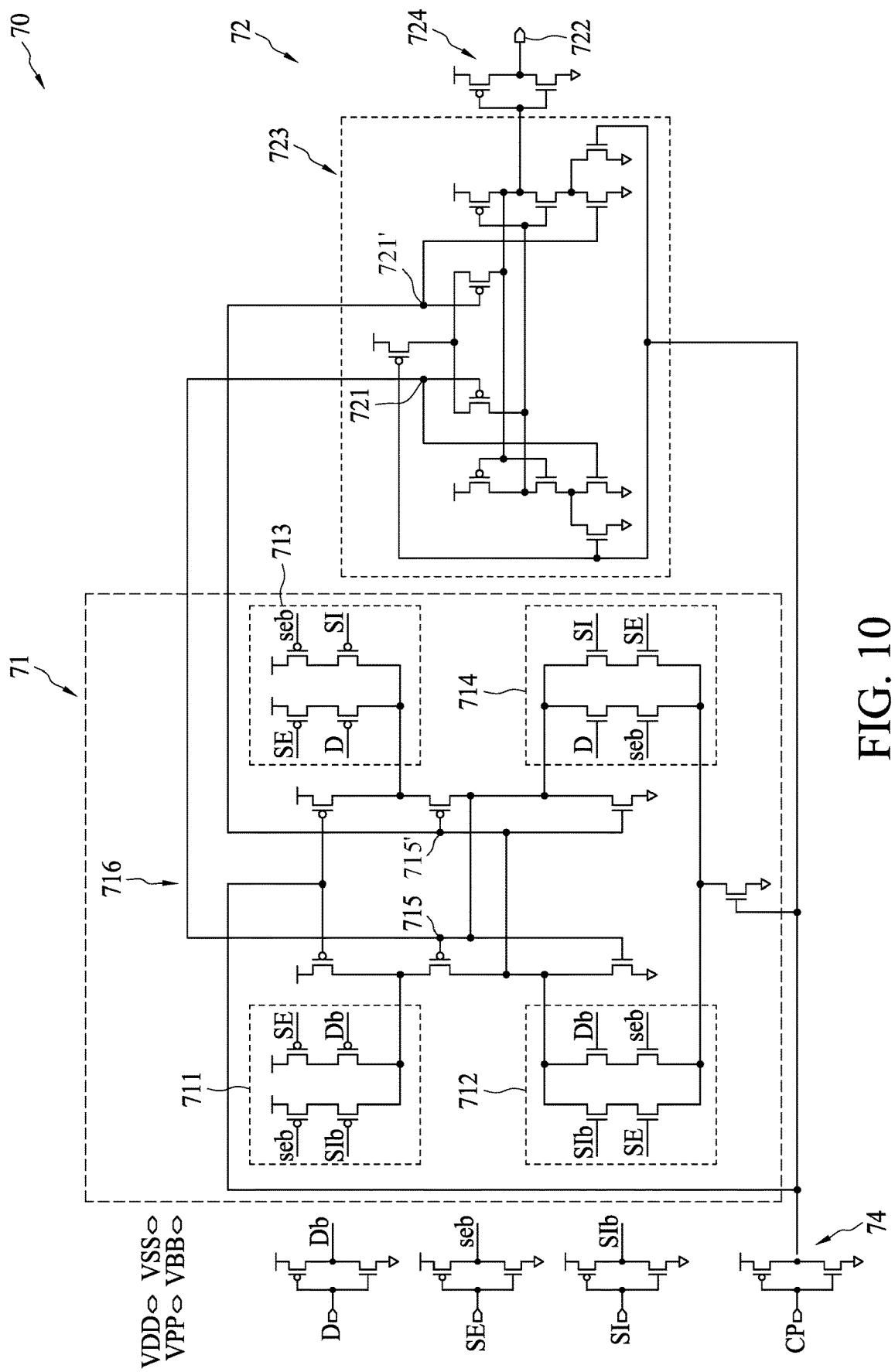
FIG. 10 illustrates a transistor-level circuit diagram of a flip flop circuit in accordance with some embodiments of the present disclosure.

FIG. 10 illustrates a transistor-level circuit diagram of a flip flop circuit in accordance with some embodiments of the present disclosure. Referring to FIG. 10, a flip flop circuit 70 includes a master portion 71, and a slave portion 72. The master portion 71 is configured to receive at least one first input, at least one second input and at least one enable signal, and generate master outputs 715, 715'. The master portion 71 includes a plurality of controlling part 711, 712, 713, 714 configured to control the master portion 71 to operate at a first mode or a second mode according to the at least one first input, the at least one second input and the at least one enable signal. In accordance with some embodiments of the present disclosure, the first mode may be a testing mode, and the second mode may be a normal mode. The at least one first input include a scan-in signal (SI) and an inverted scan-in signal (SIb), and the at least one second input include a data signal (D) and an inverted data signal (Db). The at least one enable signal include a scan enable signal (SE) and an inverted scan enable signal (seb).

In accordance with some embodiments of the present disclosure, the slave portion 72 is configured to receive the master outputs 715, 715' and generate an output signal 722. The slave portion 72 includes slave inputs 721, 721' connected to the master outputs 715, 715', respectively.

In accordance with some embodiments of the present disclosure, the master portion 71 includes a pair of cross-coupled And-Or-Inverter (AOI) logic gates 716, and the slave portion 72 includes a pair of cross-coupled Or-And-Inverter (OAI) logic gates 723 and a slave inverter 724. The pair of cross-coupled And-Or-Inverter (AOI) logic gates 716 may be implemented by a plurality of transistors to perform the "AOI" logic function. Further, the pair of cross-coupled Or-And-inverter (OAI) logic gates 723 may be implemented by a plurality of transistors to perform the "OAI" logic function, and the slave inverter 724 may be implemented by two transistors to perform the "Inverter" logic function.

In accordance with some embodiments of the present disclosure, referring to FIG. 9 and FIG. 10, the flip-flop circuit 70 is substantially similar to the flip-flop circuit 60 except that the master portion 71 of the flip-flop circuit 70 includes the pair of cross-coupled And-Or-Inverter (AOI) logic gates 716, and the slave portion 72 of the flip-flop circuit 70 includes the pair of cross-coupled Or-And-Inverter (OAI) logic gates 723. In other words, the pair of cross-coupled Or-And-Inverter (OAI) logic gates 723 in FIG. 10 is substantially similar to the pair of cross-coupled Or-And-Inverter (CAI) logic gates 616 in FIG. 9. Furthermore, the pair of cross-coupled And-Or-Inverter (AOI) logic gates 716 in FIG. 10 is substantially similar to the pair of cross-coupled And-Or-Inverter (AOI) logic gates 623 in 9. Therefore, by disposing the AOI's to the first master portion 71 and the OAI's to the slave portion 72 (i.e., swapping the AOI's and OAI's), one or more additional clock buffer circuits can be integrated into the flip-flop circuit 70 thereby reducing a loading to a clock circuit (i.e., the circuit to provide the clock signal CP).

In accordance with some embodiments of the present disclosure, In order to implement the master portion 71 by the AOI's and the slave portion 72 by the OAI's, the flip-flop circuit 70 further includes an inverter 74 that is configured to receive the clock signal CP and provide a logically inverted signal to the master portion 71 and the slave portion 72, respectively.

In accordance with some embodiments of the present disclosure, the first controlling part 711, the second controlling part 712, the third controlling part 713 and the fourth controlling part 714 may determine the master portion 71 to operate at the testing mode or the normal mode. When the master portion 71 operates under the testing mode, the scan enable signal (SE) is asserted to a logical high state (e.g., a logical "1"), and the scan-in signal (SI) and the inverted scan-in signal (SIb) are inputted to the pair of cross-coupled And-Or-Inverter (AOI) logic gates 716. Therefore, the master portion 71 generates the master outputs 715, 715' (scan-out signal). When the master portion 71 operates under the normal mode, the scan enable signal (SE) is asserted to a logical low state (e.g., a logical "0"), and the data signal (D) and the inverted data signal (Db) are inputted to the pair of cross-coupled And-Or-Inverter (AOI) logic gates 716.

In accordance with some embodiments of the present disclosure, by using the first controlling part 711, the second controlling part 712, the third controlling part 713 and the fourth controlling part 714, the master portion 71 may operate at the testing mode or the normal mode. Therefore, a conventional multiplexer disposed before the convention master latch circuit may not be needed, which may advantageously make the speed of the flip-flop circuit 70 faster, and reduce the power consumption of the flip-flop circuit 70, for example, about 17%.

Figure 11:
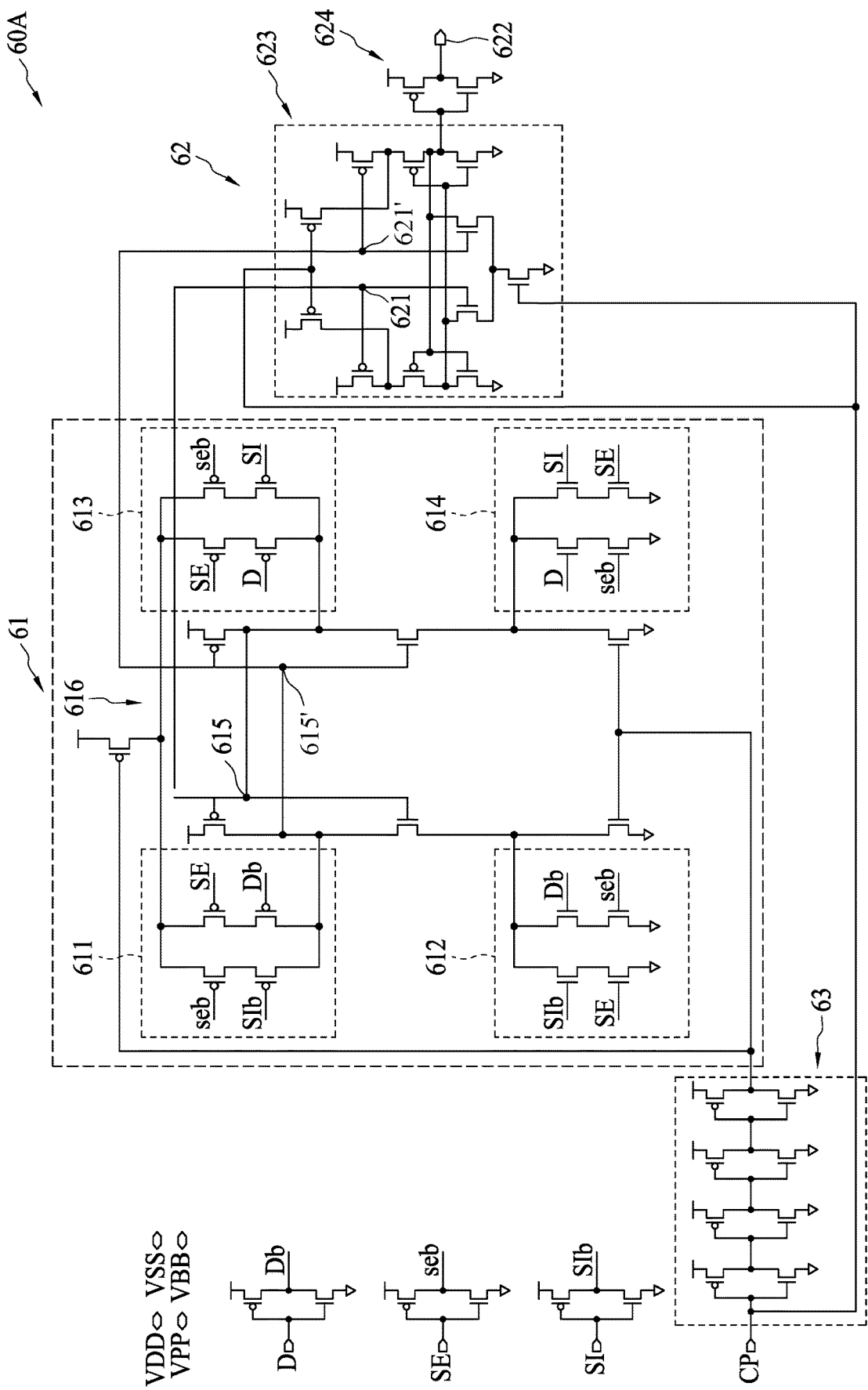
FIG. 11 illustrates a transistor-level circuit diagram of a flip flop circuit in accordance with some embodiments of the present disclosure.

FIG. 11 illustrates a transistor-level circuit diagram of a flip flop circuit in accordance with some embodiments of the present disclosure. Referring to FIG. 9 and FIG. 11, as shown, the flip-flop circuit 60A is substantially similar to the flip-flop circuit 60 of FIG. 9 except that the flip-flop circuit 60A further includes a time-borrowing circuit 63. The time-borrowing portion 63 is coupled to the master portion 61 for delaying a predetermined time of the clock signal CP to the master portion 61, and the clock signal CP is connected to the slave portion 62 without the time-borrowing portion 63. For clarity, discussions of the components of the flip-flop circuit 60A that are substantially similar to those of the flip-flop circuit 60, e.g., 61 and 62, are omitted.

In accordance with some embodiments of the present disclosure, the time-borrowing circuit 63 includes one or more inverters that are serially coupled to one another. Although the illustrated embodiment of FIG. 11 shows the time-borrowing circuit 63 includes 4 inverters, any desired number (e.g., 2~8) of inverters may be included in the time-borrowing circuit 63 while remaining within the scope of the present disclosure. Including such a time-borrowing circuit 63 in the flip-flop circuit 60A may delay the clock signal CP to be received by the master portion 61 by a number of gate delays that corresponds to a number of the inverters included in the time-borrowing circuit 63, while the slave portion 62 receives the clock signal CP without a delay. In accordance with some embodiments of the present disclosure, delaying the clock signal CP to the master portion 61 may advantageously reduce a setup time of the flip-flop circuit 60A. Since the clock signal CP is delayed to be received by the master portion 61 and the clock signal CP is immediately received by the slave portion 62 without a delay, in some embodiments, the slave portion 62 may provide a transparent window and release data earlier, which causes the master portion 61 to have more time for receiving input data during a current cycle, which in turn reduces the setup time.

In accordance with some embodiments of the present disclosure, the time-borrowing circuit 63 includes 4 inverters, and each inverter of the time-borrowing circuit 63 is substantially similar to the inverter 624. As such, the delayed dock signal received by the master portion 61 may have about four gate delays behind the clock signal CP.

Figure 12:
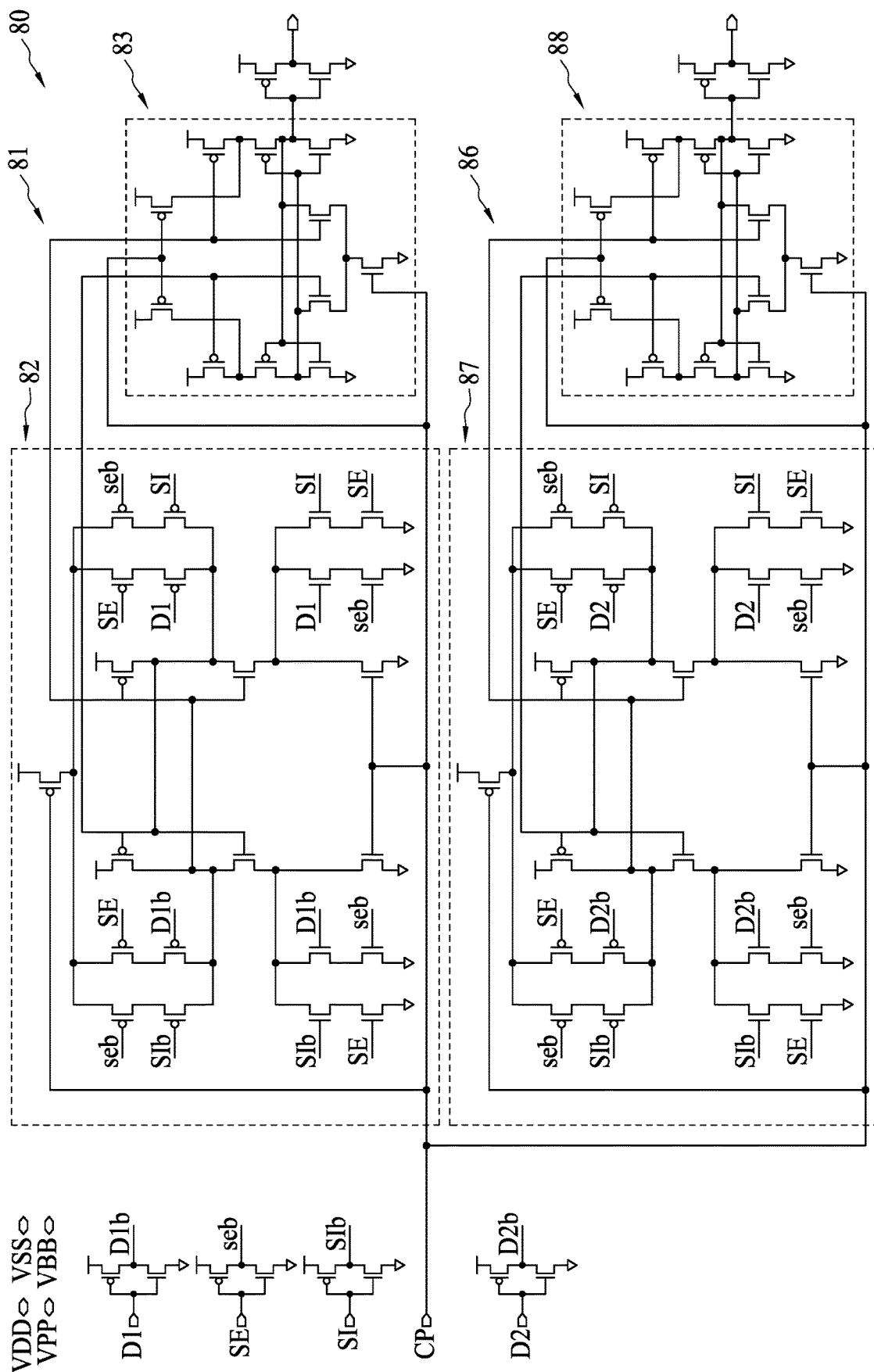
FIG. 12 illustrates a transistor-level circuit diagram of a flip flop circuit in accordance with some embodiments of the present disclosure.

FIG. 12 illustrates a transistor-level circuit diagram of a flip flop circuit in accordance with some embodiments of the present disclosure. Referring to FIG. 9 and FIG. 12, the flip-flop circuit 80 may be a multi-bit flip-flop circuit. The flip-flop circuit 80 may include a first bit flip-flop circuit 81 and a second bit flip-flop circuit 86. The second bit flip-flop circuit 86 is a duplicate of the first bit flip-flop circuit 81. The first bit flip-flop circuit 81 includes a master portion 82 and a slave portion 83. The master portion 82 is the same as the master portion 61 in FIG. 9, and the slave portion 83 is the same as the slave portion 62 in FIG. 9. The first bit flip-flop circuit 81 includes a master portion 82 and a slave portion 83. The master portion 82 is the same as the master portion 61 in FIG. 9, and the slave portion 83 is the same as the slave portion 62 in FIG. 9. The second bit flip-flop circuit 86 includes a master portion 87 and a slave portion 88. The master portion 87 is the same as the master portion 61 in FIG. 9, and the slave portion 88 is the same as the slave portion 62 in FIG. 9. The dock signal CP of the nip-flop circuit 80 may be commonly used by the first bit flip-flop circuit 81 and the second bit flip-flop circuit 86, respectively.

Figure 13:
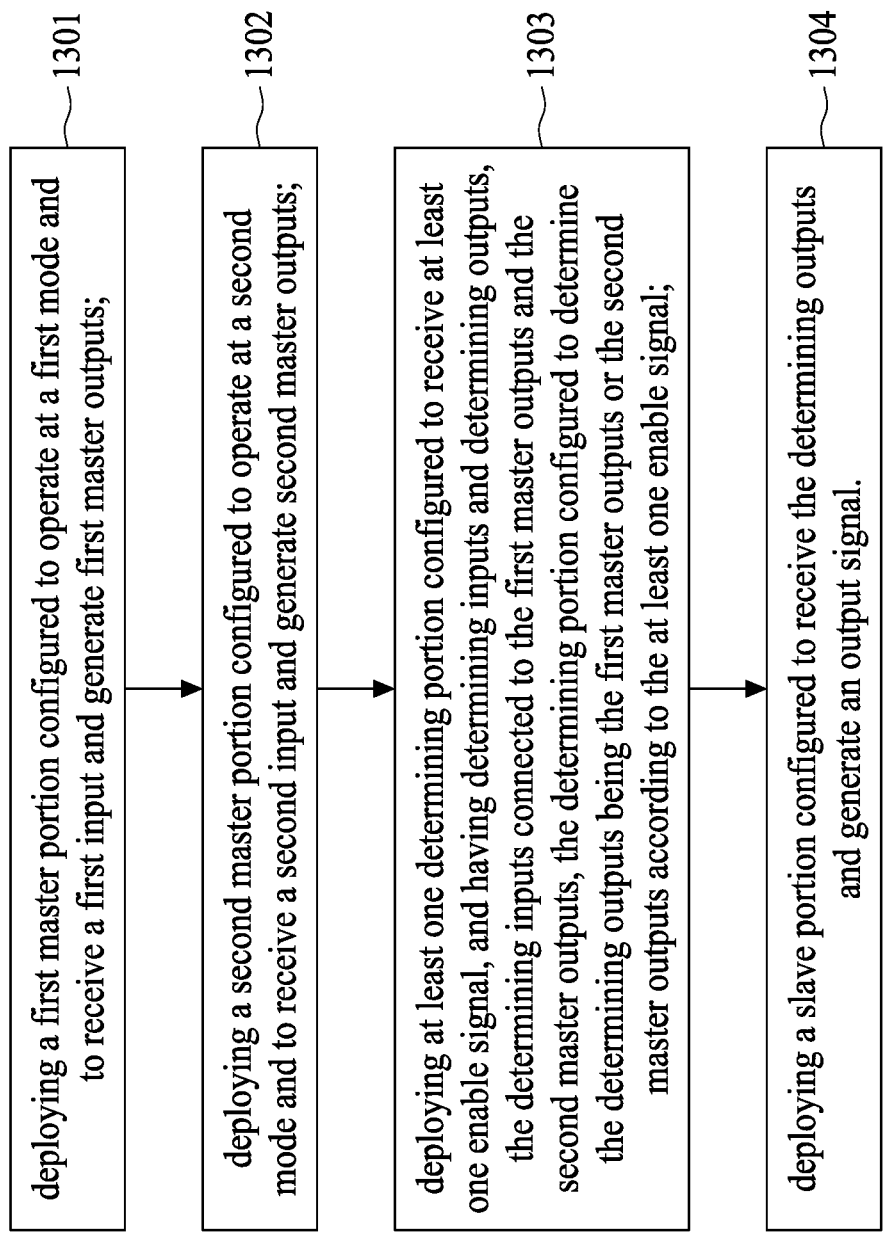
FIG. 13 is a flowchart illustrating a method for operating a flip flop circuit in accordance with some embodiments of the present disclosure.

FIG. 13 is a flowchart illustrating a method for operating a flip flop circuit in accordance with some embodiments of the present disclosure. While the process of FIG. 13 may be performed using a variety of structures, prior structures described herein are referenced for ease in understanding. Referring to FIG. 13, the method for operating the flip flop includes the first step 1301, deploying a first master portion 11 configured to operate at a first mode and to receive a first input and generate first master outputs, the second step 1302, deploying a second master portion 12 configured to operate at a second mode and to receive a second input and generate second master outputs, the third step 1303, deploying at least one determining portion 13, 14 configured to receive at least one enable signal, and having determining inputs and determining outputs, the determining inputs connected to the first master outputs and the second master outputs, the determining portion configured to determine the determining outputs being the first master outputs or the second master outputs according to the at least one enable signal, the fourth step 1304, deploying a slave portion 15 configured to receive the determining outputs and generate an output signal.

Figure 14:
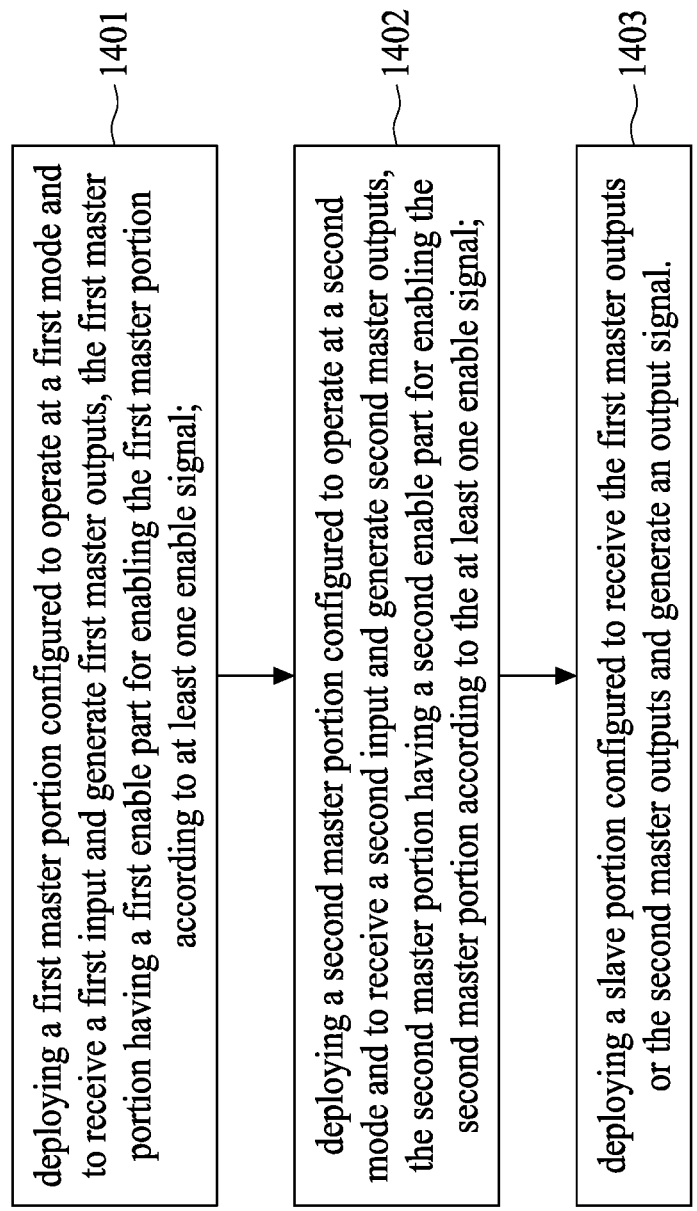
FIG. 14 is a flowchart illustrating a method for operating a flip flop circuit in accordance with some embodiments of the present disclosure.

FIG. 14 is a flowchart illustrating a method for operating a flip flop circuit in accordance with some embodiments of the present disclosure. While the process of FIG. 14 may be performed using a variety of structures, prior structures described herein are referenced for ease in understanding. Referring to FIG. 14, the method for operating the flip flop includes the first step 1401, deploying a first master portion 41 configured to operate at a first mode and to receive a first input and generate first master outputs, the first master portion having a first enable part 413 for enabling the first master portion according to at least one enable signal, the second step 1402, deploying a second master portion 42 configured to operate at a second mode and to receive a second input and generate second master outputs, the second master portion having a second enable part 423 for enabling the second master portion according to the at least one enable signal, the third step 1403, deploying a slave portion 43 configured to receive the first master outputs or the second master outputs and generate an output signal.

Figure 15:
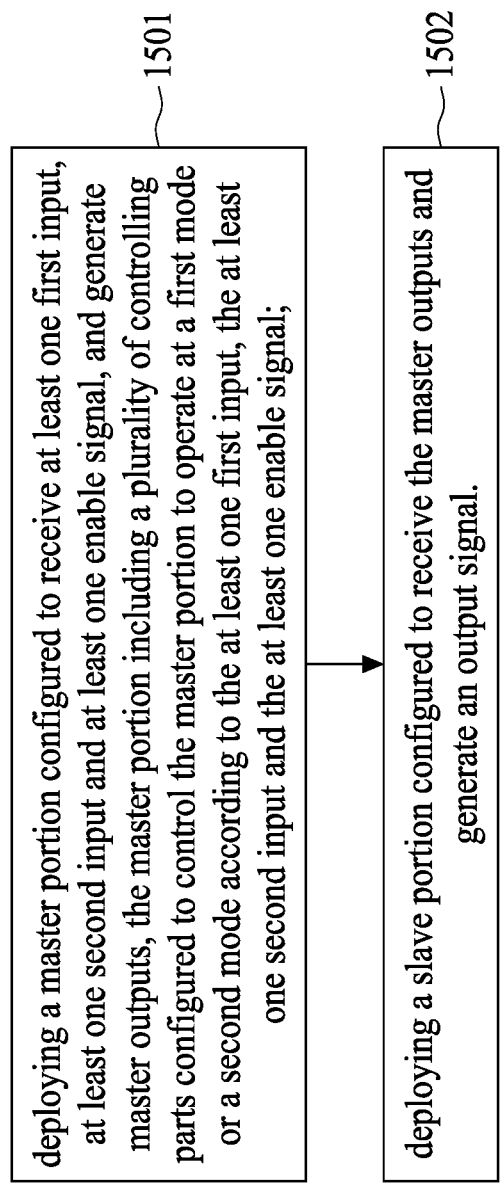
FIG. 15 is a flowchart illustrating a method for operating a flip flop circuit in accordance with some embodiments of the present disclosure.

FIG. 15 is a flowchart illustrating a method for operating a flip flop circuit in accordance with some embodiments of the present disclosure. Referring to FIG. 15, the method for operating the flip flop includes the first step 1501, deploying a master portion 61 configured to receive at least one first input, at least one second input and at least one enable signal, and generate master outputs, the master portion including a plurality of controlling parts 611, 612, 613, 614 configured to control the master portion to operate at a first mode or a second mode according to the at least one first input, the at least one second input and the at least one enable signal, the second step 1502, deploying a slave portion 62 configured to receive the master outputs and generate an output signal.

In some embodiments, a flip flop circuit is disclosed, including: a first master portion, a second master portion, at least one determining portion and a slave portion. The first master portion is configured to operate at a first mode and to receive a first input and generate first master outputs. The second master portion is configured to operate at a second mode and to receive a second input and generate second master outputs. The at least one determining portion is configured to receive at least one enable signal, and has determining inputs and determining outputs. The determining inputs are connected to the first master outputs and the second master outputs. The determining portion is configured to determine the determining outputs being the first master outputs or the second master outputs according to the at least one enable signal. The slave portion is configured to receive the determining outputs and generate an output signal.

In some embodiments, a flip flop circuit is disclosed, including: a first master portion, a second master portion and a slave portion. The first master portion is configured to operate at a first mode and to receive a first input and generate first master outputs. The first master portion has a first enable part for enabling the first master portion according to at least one enable signal. The second master portion is configured to operate at a second mode and to receive a second input and generate second master outputs. The second master portion has a second enable part for enabling the second master portion according to the at least one enable signal. The slave portion configured to receive the first master outputs or the second master outputs and generate an output signal.

In some embodiments, a flip flop circuit is disclosed, including: a master portion and a slave portion. The master portion is configured to receive at least one first input, at least one second input and at least one enable signal, and generate master outputs. The master portion includes a plurality of controlling part configured to control the master portion to operate at a first mode or a second mode according to the at least one first input, the at least one second input and the at least one enable signal. The slave portion is configured to receive the master outputs and generate an output signal.

What is claimed is:

1. A flip flop circuit, comprising:
   a first master portion configured to operate at a first mode, to receive a first input, and to generate first master outputs;
   a second master portion configured to operate at a second mode, to receive a second input, and to generate second master outputs;
   at least one determining portion including first and second determining portions, configured to receive at least one enable signal that activates one of the first and second determining portions and simultaneously deactivates the other of the first and second determining portions, and having determining inputs and determining outputs, the determining inputs configured to receive the first master outputs and the second master outputs, the at least one determining portion configured to provide at the determining outputs the first master outputs when the first determining portion is activated or the second master outputs when the second determining portion is activated; and
   a slave portion including first and second logic gates, connected to the determining outputs, and configured to generate an output signal.

2. The flip flop circuit of claim 1, wherein the first mode is a testing mode, the second mode is a normal mode, the first input is a scan-in signal, the second input is a data signal, and the at least one enable signal comprise a scan enable signal and an inverted scan enable signal.

3. The flip flop circuit of claim 1, wherein the first master portion comprises cross-coupled first and second Or-And-Inverter (OAI) logic gates and a first master inverter having an input connected to an input of the first OAI logic gates and an output connected to an input of the second OAI logic gates, the input of the first OAI logic gates is configured to receive the first input, and an output of each of the first and second OAI logic gates is configured to provide a respective one of the first master outputs.

4. The flip flop circuit of claim 1, wherein the first determining portion comprises a pair of transistors controlled by the at least one enable signal, and an inverter connected between the transistors and having an input that serves as one of the determining inputs and an output that serves as one of the determining outputs.

5. The flip flop circuit of claim 1, wherein the first determining portion includes an inverter having an input that serves as one of the determining inputs and an output that serves as one of the determining outputs.

6. The flip flop circuit of claim 5, wherein the first determining portion further includes a transistor connected between a supply voltage and the inverter.

7. The flip-flop circuit of claim 1, wherein one of the first and second logic gates is an AND gate, the other of the first and second logic gates is an OR gate, an input of the first logic gate is connected to one of the determining outputs, an input of the second logic gate is connected to an output of the first logic gate, and the slave portion further includes a third logic gate having an input connected to an output of the second logic gate and an output configured to provide the output signal.

8. A flip flop circuit, comprising:
a first master portion configured to operate at a first mode, to receive a first input, and to generate first master outputs;
a second master portion configured to operate at a second mode, to receive a second input, and to generate second master outputs different from the first master outputs; and
a slave portion including first and second logic gates and configured to receive the first master outputs or the second master outputs and to generate an output signal.

9. The flip flop circuit of claim 8, wherein the first mode is a testing mode, the second mode is a normal mode, the first input is a scan-in signal, and the second input is a data signal.

10. The flip flop circuit of claim 8, wherein the first master portion comprises: cross-coupled first and second Or-And-Inverter (OAI) logic gates and a first master inverter having an input connected to an input of the first OAI logic gates and an output connected to an input of the second OAI logic gates, the input of the first OAI logic gates is configured to receive the first input, and the output of each of the first and second OAI logic gates is configured to provide a respective one of the first master outputs.

11. The flip flop circuit of claim 8, further comprising an inverter having an input configured to receive one of the first master outputs and an output connected to the slave portion.

12. The flip flop circuit of claim 11, further comprising a transistor connected between a supply voltage and the inverter.

13. The flip flop circuit of claim 8, further comprising an inverter having an input configured to receive one of the second master outputs and an output connected to the slave portion.

14. The flip flop circuit of claim 13, further comprising a transistor connected between a supply voltage and the inverter.

15. A flip flop circuit, comprising:
a first master portion including first and second logic gates connected in a first sequence and configured to receive a first input and to generate first master outputs;
a second master portion configured to receive a second input and to generate second master outputs different from the first master outputs; and
a slave portion including third and fourth logic gates the same as the first and second logic gates, respectively, and connected in a second sequence opposite the first sequence, the slave portion being configured to receive the first master outputs or the second master outputs and to generate an output signal.

16. The flip flop circuit of claim 15, wherein the first input comprises a scan-in signal.

17. The flip flop circuit of claim 15, wherein one of the first and second logic gates is an OR gate, the other of the first and second logic gates is an AND gate, an input of the first logic gate is configured to receive the first input, an input of the second gate is connected to an output of the first logic gate, and the first master portion further includes a third logic gate having an input connected to an output of the second logic gate and an output configured to provide one of the first master outputs.

18. The flip flop circuit of claim 15, further comprising a determining portion including a pair of inverters, each of which has an input configured to receive a respective one of the first master outputs and an output connected to the slave portion.

19. The flip flop circuit of claim 15, further comprising an inverter connected between the first master portion and the slave portion.

20. The flip flop circuit of claim 19, further comprising a transistor connected between a supply voltage and the inverter.

* * * * *